(12) United States Patent
Wu

(10) Patent No.: US 6,627,927 B2
(45) Date of Patent: Sep. 30, 2003

(54) DUAL-BIT FLASH MEMORY CELLS FOR FORMING HIGH-DENSITY MEMORY ARRAYS

(76) Inventor: Ching-Yuan Wu, 1F, No. 23, R&D Rd. 1, Science-Based Industrial Park, Hsinchu (TW)

( * ) Notice: Subject to any disclaimer, the term of this patent is extended or adjusted under 35 U.S.C. 154(b) by 17 days.

(21) Appl. No.: 10/058,427

(22) Filed: Jan. 30, 2002

(65) Prior Publication Data

US 2003/0141541 A1 Jul. 31, 2003

(51) Int. Cl.[7] .............................................. H01L 29/76
(52) U.S. Cl. ....................... 257/213; 257/315; 257/316; 257/319; 257/320; 257/326; 257/314
(58) Field of Search ................................ 257/213, 314, 257/315, 316, 319, 320, 326; 365/185.03, 185.29, 185.33

(56) References Cited

U.S. PATENT DOCUMENTS

| | | | | |
|---|---|---|---|---|
| 5,364,806 A | * | 11/1994 | Ma et al. ..................... | 438/266 |
| 5,989,960 A | * | 11/1999 | Fukase ........................ | 438/267 |
| 6,151,248 A | * | 11/2000 | Harari et al. .......... | 365/185.14 |
| 6,255,205 B1 | * | 7/2001 | Sung ........................... | 438/595 |
| 6,281,545 B1 | * | 8/2001 | Liang et al. ................ | 257/315 |
| 6,512,263 B1 | * | 1/2003 | Yuan et al. .................. | 257/316 |

OTHER PUBLICATIONS

Advanced Flash Memory Technology and Trends for File Storage Application, by Seiichi Aritome, pp. 33.1.1–33.2.4.
"Dry–Etching Various Types of Thin Films", *Silicon Processing for the VLSI Era*, pp. 555–558.
Manufacturing Methods, Chapter 10 Etching, pp. 641–650.

* cited by examiner

*Primary Examiner*—Richard Elms
*Assistant Examiner*—Doug Menz

(57) ABSTRACT

The dual-bit flash memory cells of the present invention include three regions: the gate region, the first-side region, and the second-side region. The gate region is formed between the first-side region and the second-side region and is defined by a masking photoresist step and is scalable. The gate region includes two stack-gate transistors formed in the side portions of the gate region with a select-gate transistor being formed therebetween for the first embodiment of the present invention and with a bit-line conductive island formed over a common-drain diffusion region for the second embodiment of the present invention. The first-side/second-side region includes a common-source conductive bus line being integrated with a conductive erasing anode for high-speed erasing. The cell size of each bit is smaller than $4F^2$.

8 Claims, 15 Drawing Sheets

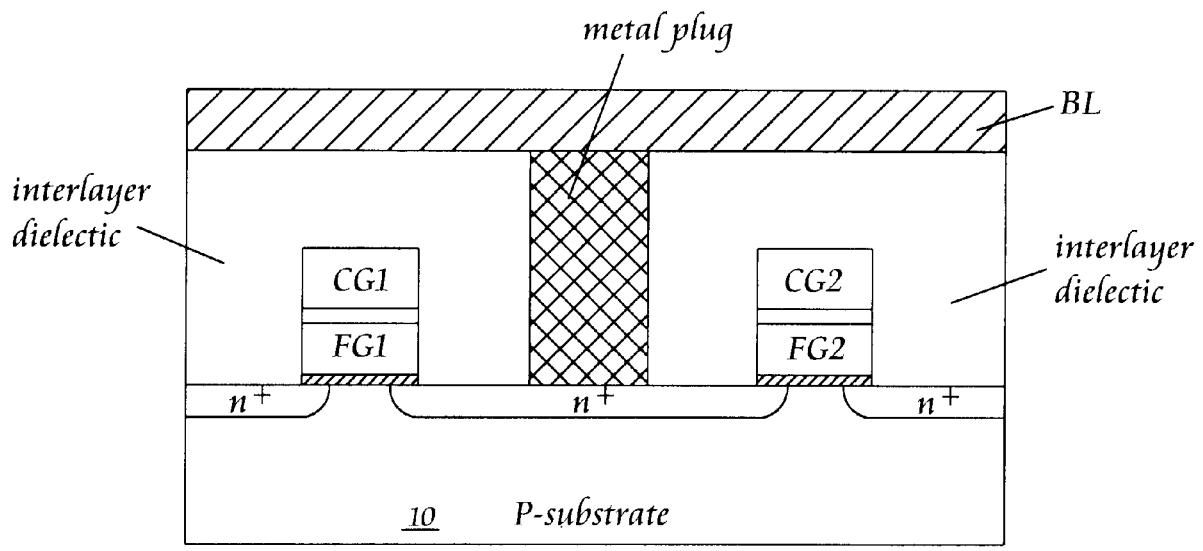
*FIG.1A(a) (PRIOR ART)*
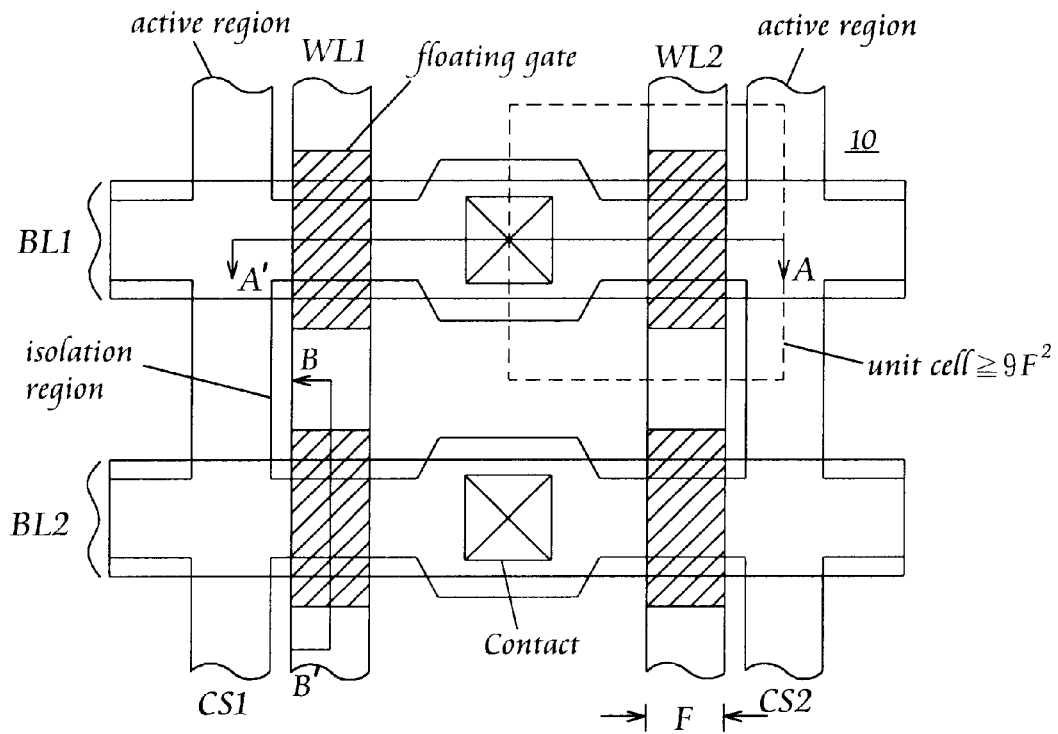
*FIG.1A(b) (PRIOR ART)*

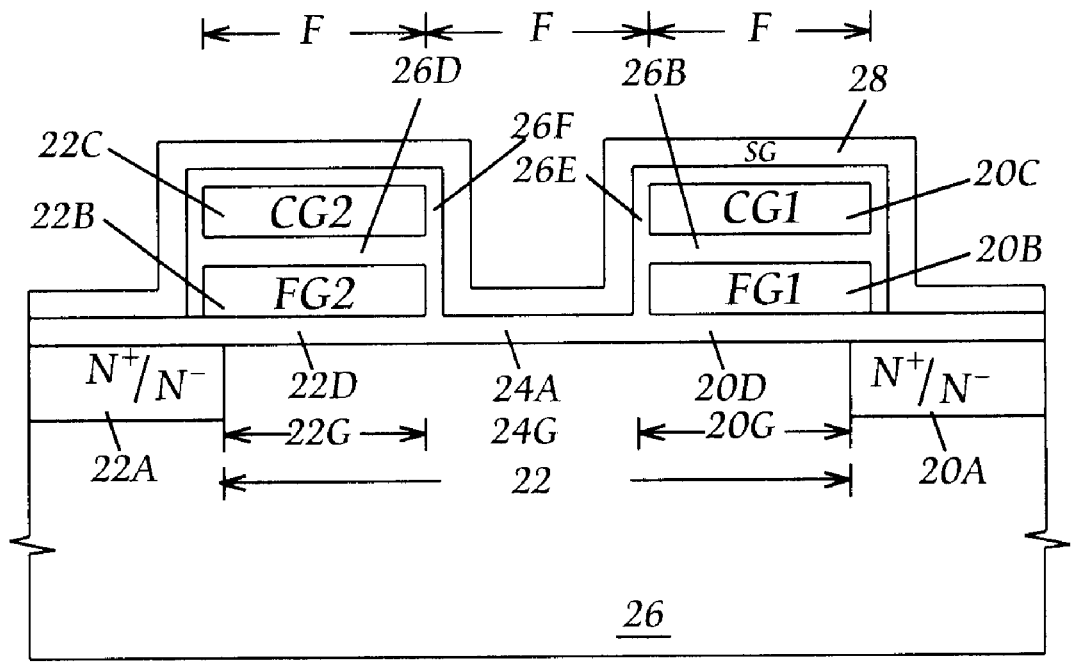
FIG.1B(a) (PRIOR ART)
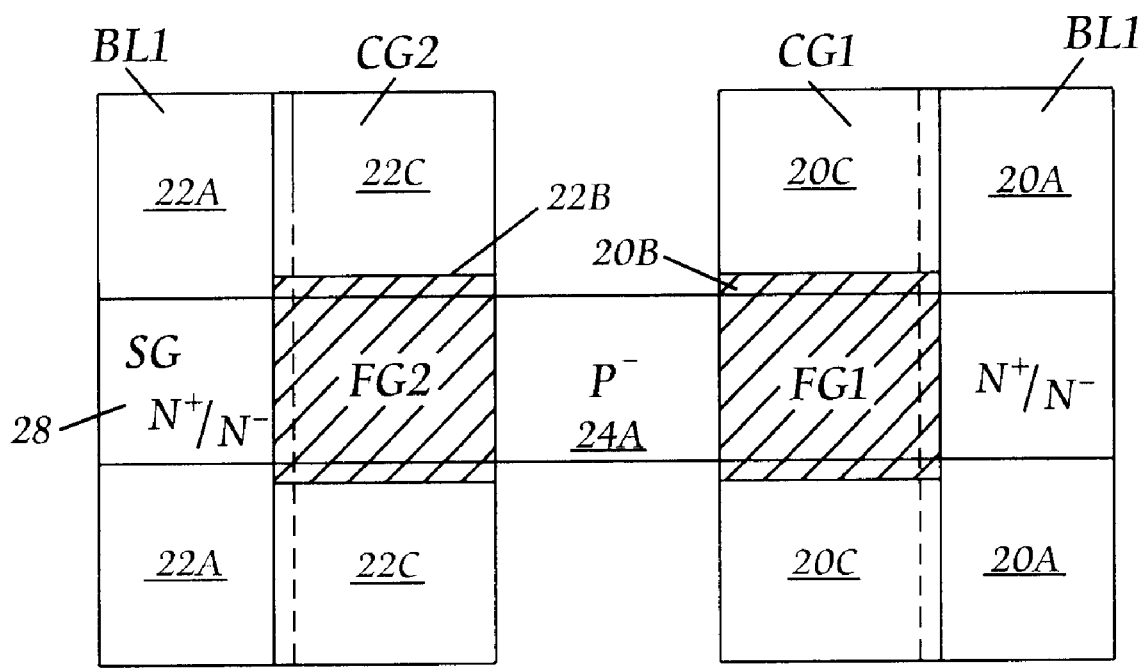
FIG.1B(b) (PRIOR ART)

US 6,627,927 B2

DUAL-BIT FLASH MEMORY CELLS FOR FORMING HIGH-DENSITY MEMORY ARRAYS

BACKGROUND OF THE INVENTION

1. Field of the Invention

The present invention relates in general to a flash memory cell and its memory array and, more particularly, to a scalable dual-bit memory cell and its memory array for high-density mass storage applications.

2. Description of the Related Art

A stack-gate flash memory cell is known to be a one-transistor cell, in which the gate length of a cell can be defined by using the minimum-feature-size (F) of technology used. Therefore, the stack-gate flash memory cell is often used in existing high-density flash memory system. The stack-gate flash memory cells can be interconnected in series to form a high-density NAND-type array with common source/drain diffusion regions. However, the read speed is slow for an NAND-type array due to the series resistance of the configuration. Moreover, an NAND-type flash memory cell is programmed by Fowler-Nordheim tunneling across the thin tunneling-oxide layer between the floating-gate and the common source/drain diffusion region and its programming speed is relatively slow. In addition, when the gate length of a stack-gate flash memory cell in an NAND-type array is further scaled down, the junction depth of common-source/drain diffusion regions must be scaled accordingly, and the overlapped region between the floating-gate and the common-source/drain diffusion region becomes smaller, resulting in a further slow process for programming and erasing.

The stack-gate flash memory cell can be connected with a common-source diffusion line and each of the drain diffusion regions being connected to a bit line through a contact for an NOR-type flash memory array. The read speed of an NOR-type flash memory array is much faster as compared to that of an NAND-type flash memory array. Moreover, a stack-gate flash memory cell in an NOR-type flash memory array is in general programmed by channel hot-electron injection and its programming speed is much faster than that of an NAND-type flash memory array. The erasing speed of an NOR-type flash memory array is quite similar to that of a NAND-type flash memory array and is limited by Fowler-Nordheim tunneling across the thin tunneling-oxide layer between the floating-gate and the common-source diffusion line.

A typical NOR-type array is shown in FIG. 1A, in which FIG. 1A($a$) shows a cross-sectional view of an NOR-type flash memory array in A—A' direction as indicated in FIG. 1A($b$) and FIG. 1A($b$) shows a top plan view of an NOR-type flash memory array. As shown in FIG. 1A($a$) and FIG. 1A($b$), a larger active region must be preserved for a contact formed on a heavily-doped (n+) drain diffusion region in order to connect with a bit line (BL) and an unit cell as marked by the dash line is in general equal to or larger than $9F^2$. It is clearly seen that the larger cell size of an NOR-type flash memory array is a major obstacle for high-density mass storage applications. Therefore, a flash memory cell taking advantages of the high-density feature of a stack-gate structure becomes a major trend of technology development and FIG. 1B shows one of the examples, in which FIG. 1B($a$) shows a cross-sectional view of a dual-bit flash memory cell and FIG. 1B($b$) shows a top plan view of the dual-bit flash memory cell.

As shown in FIG. 1B($a$) and FIG. 1B($b$), a gate region of a dual-bit flash memory cell including two stack-gate transistors 22G, 20G and a select-gate transistor 24G is formed on a semiconductor substrate 26, in which two common $N^+/N^-$ diffusion regions 22A, 20A are formed in the semiconductor substrate 26 outside of the gate region and a select-gate line (SG) is formed above two common $N^+/N^-$ diffusion regions and two stack-gate transistors, and on a gate-dielectric layer 24A being formed on a semiconductor substrate 26. Since the stack-gate transistor, the select-gate transistor and the common $N^+/N^-$ diffusion region can be defined by a masking photoresist step with a minimum-feature-size F, the cell size of each bit in a dual-bit flash memory cell is $4F^2$ if the select-gate line and its space can be defined to be a minimum-feature-size F. Apparently, there are several drawbacks: very high capacitance between the select-gate line (SG) and the common $N^+/N^-$ diffusion regions 22A, 20A; very high capacitance between the select-gate line(SG) and the control-gate lines 22C, 20A; isolation between the common $N^+/N^-$ diffusion regions is poor for the regions outside of the select-gate region 24A; and isolation between nearby select-gate lines is very poor for the regions under the control-gate lines 22C, 20C. It should be noted that poor isolation between nearby select-gate lines may result in an erroneous data reading from nearby cells under the same control-gate line.

It is therefore an objective of the present invention to provide a dual-bit flash memory cell having a cell size of each bit being smaller than $4F^2$ and scalable.

It is another objective of the present invention to provide a shallow-trench-isolation structure for the dual-bit flash memory cells in nearby rows of an array.

It is further objective of the present invention to provide two common-source conductive bus lines for a dual-bit flash memory cell in a contactless NOR-type array to enhance the erasing speed.

It is yet another objective of the present invention to provide two common conductive bit lines for a dual-bit flash memory cell with a select-gate in a contactless NOR-type array to enhance the erasing speed.

Other objectives and advantages of the present invention will be more apparent from the following description.

SUMMARY OF THE INVENTION

The dual-bit flash memory cells and their memory arrays are disclosed by the present invention. A dual-bit flash memory cell is formed on a semiconductor substrate of a first conductivity type with an active region being formed between two shallow-trench-isolation (STI) regions and each of STI regions comprises a raised field-oxide layer. The dual-bit flash memory cell of the present invention includes three regions: the first-side region, the gate region, and the second-side region, in which the gate region is formed between the first-side region and the second-side region and is defined by a masking photoresist step and is therefore scalable. The gate region comprises two stack-gate transistors being formed in the side portions of the gate region having a select-gate transistor formed between two stack-gate transistors for the first embodiment of the present invention and having a planarized conductive island formed between a pair of sidewall dielectric spacers and over a common-drain diffusion region of a second conductivity type between two stack-gate transistors for the second embodiment of the present invention. The stack-gate transistor comprises from top to bottom a sidewall dielectric spacer being formed over a sidewall of a first-side/second-side region, an elongated control-gate layer being formed over an intergate dielectric layer, and an integrated floating-gate layer. The integrated floating-gate layer comprises a major floating-gate layer being formed over a thin tunneling-dielectric layer and two extended floating-gate layers being formed separately on a portion of nearby raised field-oxide layers. The select-gate transistor comprises a planarized conductive island being formed over a gate-dielectric layer on a semiconductor surface and over two stack-gate transistors and an implanted region having a shallow implant region for threshold-voltage adjustment and a deep implant region for forming a punch-through stop.

The first-side/second-side region comprises a pair of sidewall dielectric-spacer structures being formed over the sidewalls of nearby gate regions and comprises from top to bottom a planarized thick-oxide layer, a silicide layer, and a common-source conductive bus line formed over a flat bed, wherein the flat bed is formed by a common-source diffusion region and two etched raised field-oxide layers. The sidewall dielectric-spacer structure comprises from top to bottom a sidewall dielectric spacer, a poly-oxide layer, a conductive erasing anode, and a thermal-oxide layer formed over the common-source diffusion region, wherein a tunneling poly-oxide layer is formed between the conductive erasing anode and the integrated floating-gate layer and the conductive erasing anode is electrically integrated with the common-source conductive bus line.

For a dual-bit flash memory cell of the first embodiment of the present invention, a word line (or select line) is formed transversely to the elongated control-gate lines of two stack-gate transistors and is electrically connected with the planarized conductive island of the select-gate transistor, wherein a hard masking layer including a masking dielectric layer and its two sidewall dielectric spacers is used to simultaneously pattern and etch the word line and the planarized conductive island. For a dual-bit flash memory cell of the second embodiment of the present invention, a bit line is formed transversely to the elongated control-gate lines of two stack-gate transistors and is electrically connected with the planarized conductive island being formed over a common-drain diffusion region, wherein a hard masking layer including a masking dielectric layer and its sidewall dielectric-spacers is used to simultaneously pattern and etch the bit line and the planarized conductive island.

The dual-bit flash memory cells of the present invention are sepatately integrated to form a memory array, wherein the common-source conductive bus lines are acted as the bit lines for the first embodiment of the present invention and the common-source conductive bus lines are acted as the source lines for the second embodiment of the present invention.

BRIEF DESCRIPTION OF THE DRAWINGS

FIG. 1A and FIG. 1B show the schematic diagrams of the prior arts, in which FIG. 1A(a) shows a cross-sectional view of a simplified NOR-type array and FIG. 1A(b) shows a top plan view of the simplified NOR-type array ; FIG. 1B(a) shows a cross-sectional view of a dual-bit flash memory cell and FIG. 1B(b) shows a top plan view of the dual-bit flash memory cell.

FIG. 2B shows a top plan view of a dual-bit flash memory array for the first/second embodiment of the present invention; FIG. 2C(a) shows a circuit diagram of a dual-bit flash memory array for the first embodiment of the present invention and FIG. 2C(b) shows a circuit diagram of a dual-bit flash memory array for the second embodiment of the present invention.

FIG. 5B(a) through FIG. 5B(c) show the cross-sectional views along B—B', C—C' and D—D' lines as indicated in FIG. 4J(b), respectively.

DETAILED DESCRIPTION OF THE PREFERRED EMBODIMENTS

Figure 2A:
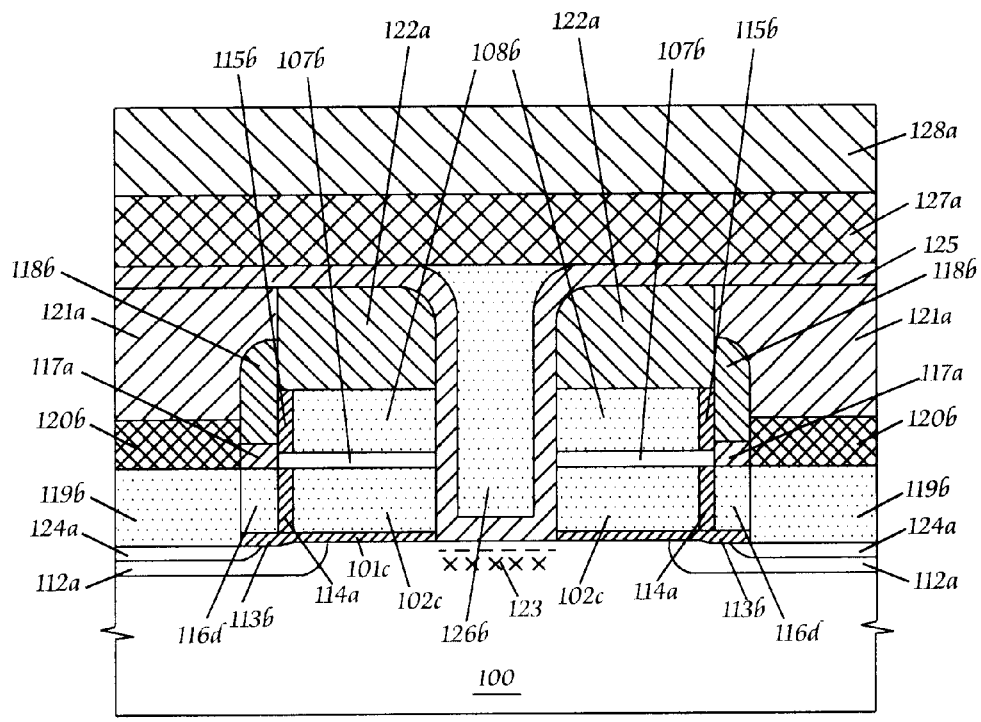
FIG. 2A through FIG. 2C show the schematic diagrams of the present invention, in which FIG. 2A(a) shows a cross-sectional view of a dual-bit flash memory cell for the first embodiment of the present invention and FIG. 2A(b) shows a cross-sectional view of a dual-bit flash memory cell for the second embodiment of the present invention.
Figure 2A:
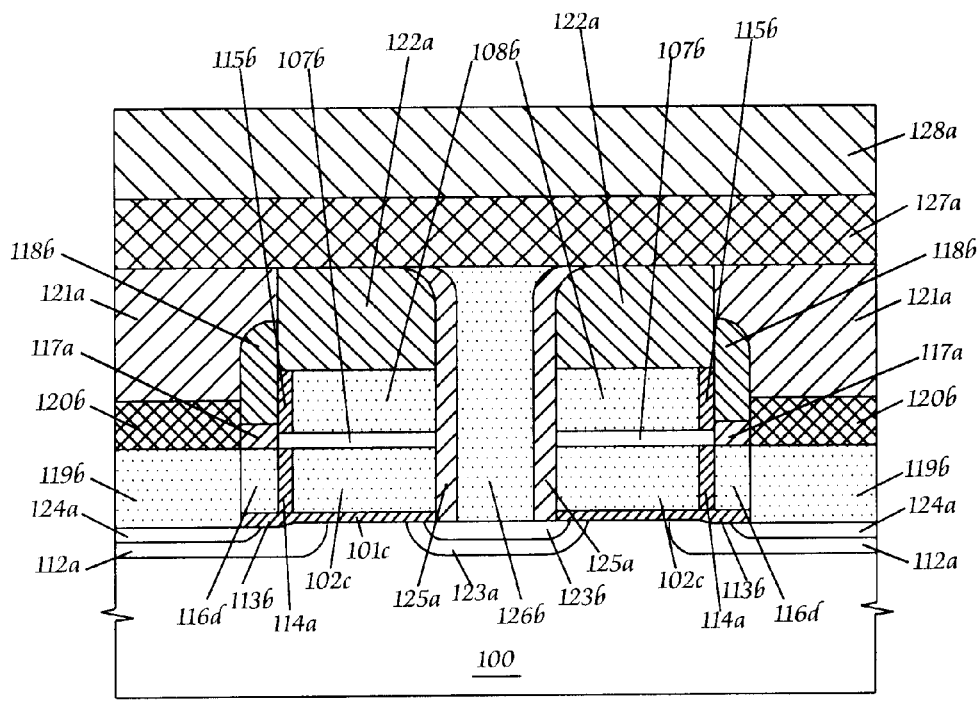
Figure 2B:
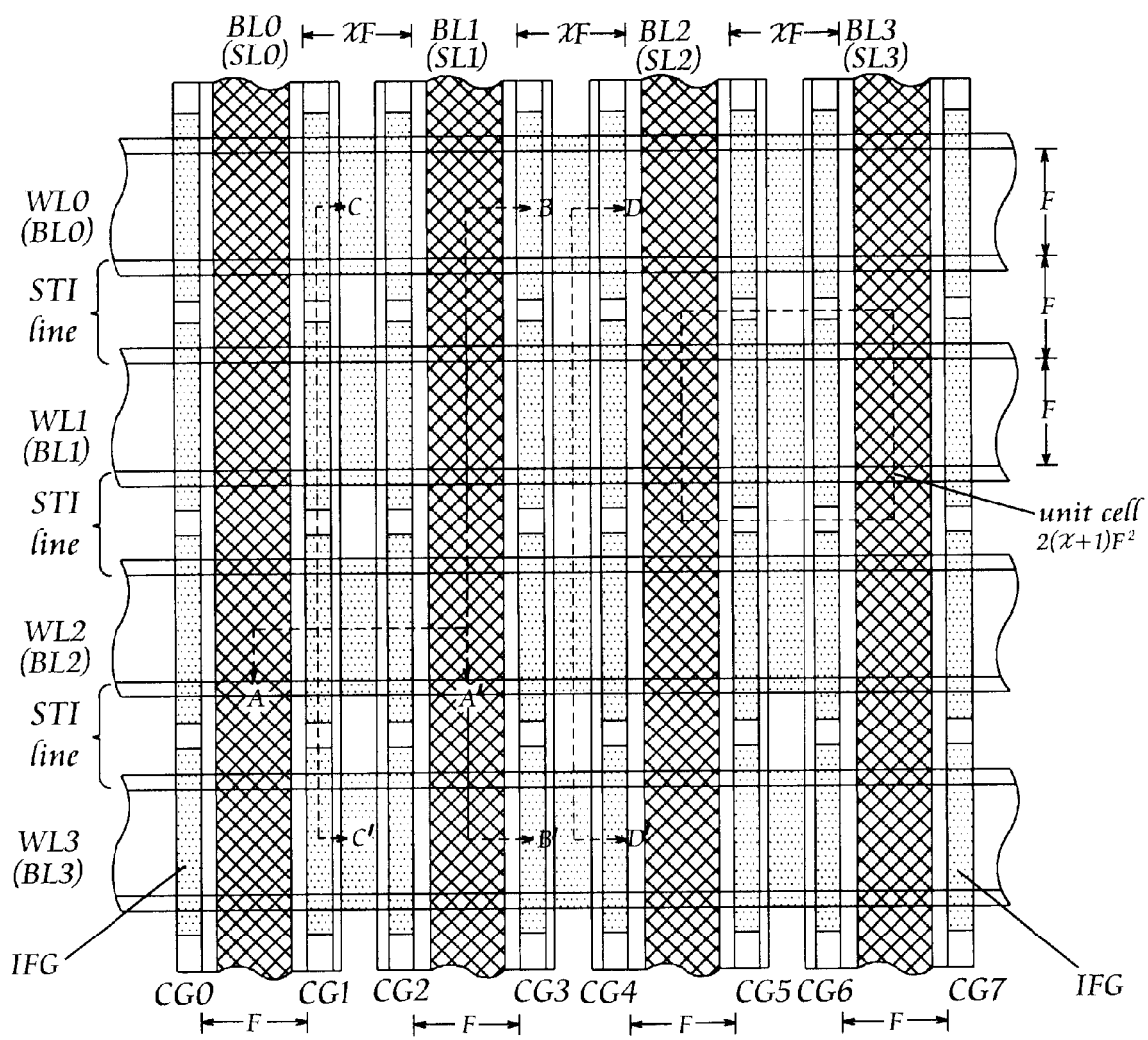
Figure 2C:
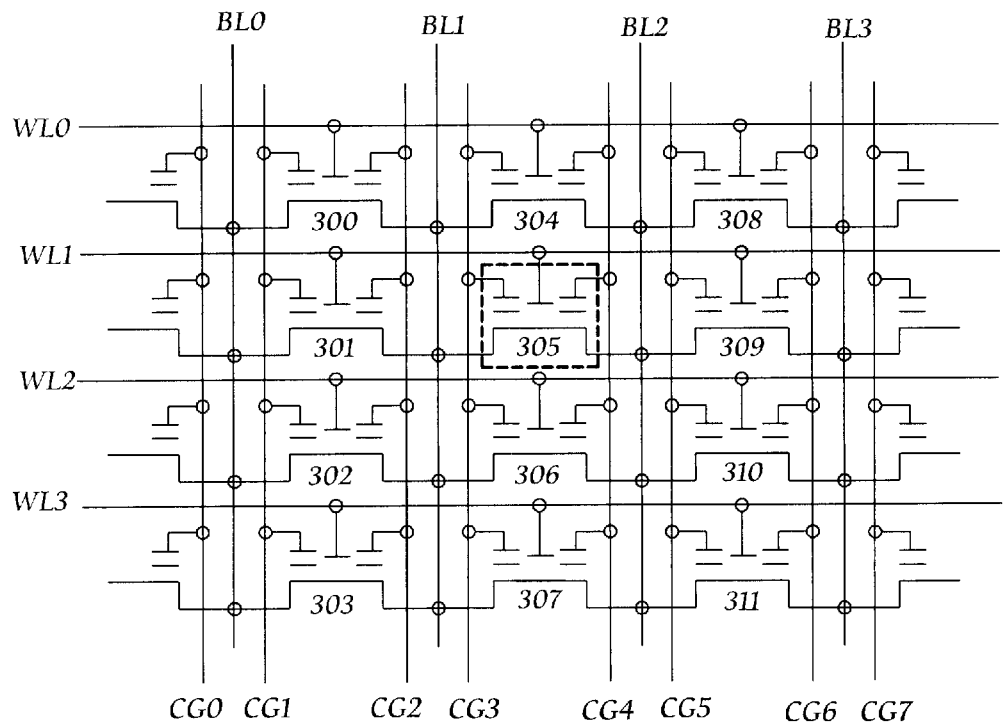
Figure 2C:
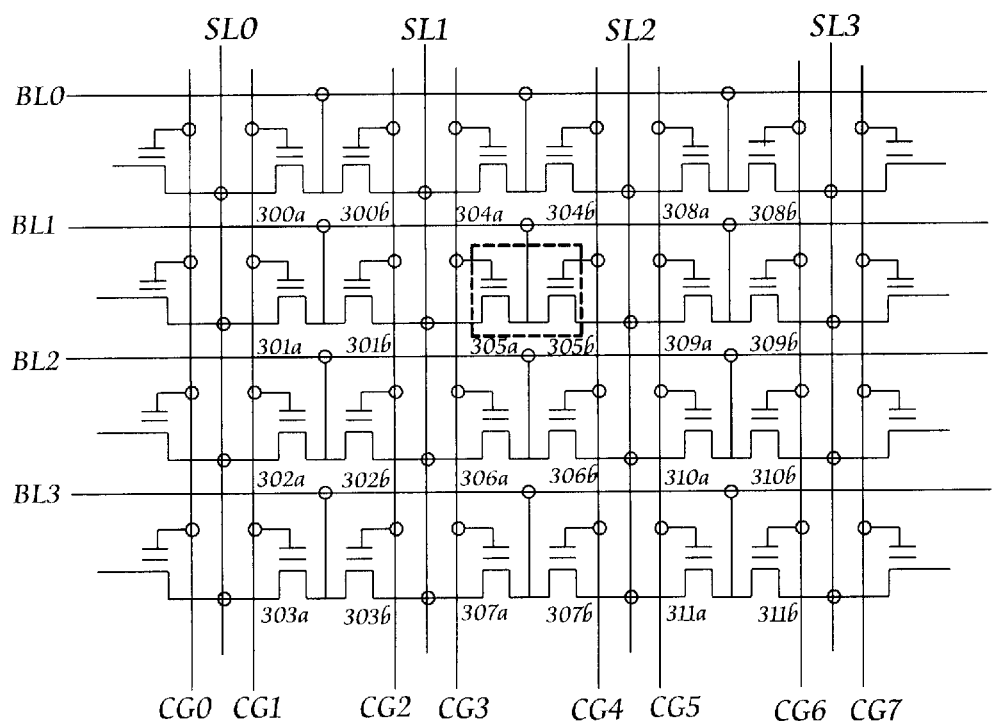

Referring now to FIG. 2A through FIG. 2C, there are shown the schematic diagrams of the present invention. FIG. 2A(a) shows a cross-sectional view of a dual-bit flash memory cell for the first embodiment of the present invention and FIG. 2A(b) shows a cross-sectional view of a dual-bit flash memory cell for the second embodiment of the present invention. As shown in FIG. 2A(a) and FIG. 2A(b), the dual-bit flash memory cells can be divided into three regions; the first-side region, the gate region, and the second-side region, in which the gate region is situated between the first-side region and the second-side region. The major difference between FIG. 2A(a) and FIG. 2A(b) is the central portion of the gate region. The first-side/second-side region is the common conductive bus-line region, which comprises a sidewall dielectric-spacer structure being formed over each sidewall of a gate region and further comprises from top to bottom a planarized thick-oxide layer 121a, a silicide layer 120b, and a common conductive bus line 119b being formed between the sidewall dielectric-spacer structure and on a heavily-doped diffusion region 124a of a second conductivity type formed within a lightly-doped diffusion region 112a of a second conductivity type. The sidewall dielectric-spacer structure comprises from top to bottom a sidewall dielectric spacer 118b, a thermal poly-oxide layer 117a, a conductive erasing anode 116d, and a thermal-oxide layer 113b, in which the conductive erasing anode 116d is integrated with the common conductive bus line 119b and a tunneling poly-oxide layer 114a is spaced between the conductive erasing anode 116d and the integrated floating-gate layer. The common conductive bus line 119b is formed over a first flat bed being formed by the heavily-doped diffusion region 124a sandwiched between the nearby etched raised field-oxide layers 104c (not shown) and the conductive erasing anode 116d is also formed on another flat bed being formed by the thermal-oxide layer 113b and the nearby etched raised field-oxide layers. The gate region comprises two stack-gate transistor regions being formed in each side portion and a selector region being formed between two stack-gate transistor regions. The stack-gate transistor region comprises from top to bottom a sidewall dielectric spacer 122a being formed over a sidewall of the common conductive bus-line region, an elongated control-gate layer 108b being formed over an intergate dielectric layer 107b, and an integrated floating-gate layer. The integrated floating-gate layer comprises a major floating-gate layer 102c being formed over a thin tunneling-dielectric layer 101c and two extended floating-gate layers 105c being formed over a portion of nearby two raised field-oxide layers 104b.

As shown in FIG. 2A(a), a gate-dielectric layer 125 is formed over a second flat bed between two stack-gate transistor regions, two stack-gate transistor regions and their inner sidewalls, and the planarized thick-oxide layers 121a in the first-side/second-side regions; a planarized conductive island 126b over the gate-dielectric layer 125 between two stack-gate transistor regions; a metal layer 127a acting as a word line(select line)is formed over the gate-dielectric layer 125 and the planarized conductive island 126b; a hard masking layer including a masking dielectric layer 128a and its two sidewall dielectric spacers 129a being formed over the metal layer 127a is used to simultaneously pattern and etch the metal layer 127a and the planarized conductive island 126b; and the implanted region 123 of a first conductivity type formed in a semiconductor substrate 100 under the gate-dielectric layer 125 comprises a shallow implant region (the dash line)for threshold-voltage adjustment and a deep implant region (the cross symbols) for forming a punch-through stop.

As shown in FIG. 2A(b), an ion-implantation is performed to form a common-drain diffusion region having a heavily-doped diffusion region 123b of a second conductivity type formed within a moderately-doped diffusion region 123a of a first conductivity type. It should be noted that a moderately-doped diffusion region 123a can be removed and the common-drain diffusion region becomes a heavily-doped diffusion region 123b. A second flat bed comprises a heavily-doped diffusion region 123b and two nearby etched field-oxide layers 104c and a pair of sidewall dielectric spacers 125a are formed over the inner sidewalls of two stack-gate transistor regions; a planarized conductive island 126b is formed between the pair of sidewall dielectric spacers 125a and on the second flat bed. Similarly, a metal layer 127a acting as a bit line is formed over the planarized conductive island 126b, the planarized thick-oxide layers 121a and the stack-gate transistor regions; a hard masking layer including a masking dielectric layer 128a and its two sidewall dielectric spacers 129a is formed over the metal layer 127a and is used to simultaneously pattern and etch the metal layer 127a and the planarized conductive island 126b.

Referring now to FIG. 2B, there is shown a top plan view of a flash memory array of the present invention, in which FIG. 2A(a) or FIG. 2A(b) is a cross-sectional view as indicated by A—A' line. As shown in FIG. 2B, a plurality of parallel shallow-trench-isolation regions (STI line) and a plurality of active regions being formed therebetween are formed on a semiconductor substrate 100 of a first conductivity type. A plurality of gate regions as marked by XF being formed alternately and transversely to the plurality of parallel STI regions are defined by a masking photoresist step and are therefore scalable; a plurality of common conductive bus-line regions are alternately formed between the plurality of gate regions. Each of the plurality of common conductive bus-line regions comprises a silicided conductive bus line (as masked by BL0~BL3/SL0~SL3) being formed between a pair of sidewall dielectric-spacer structures as described in FIG. 2A(a) and FIG. 2A(b) and on a first flat bed formed alternately by the heavily-doped diffusion region 124a and the etched raised field-oxide layer 104c. Each of the plurality of gate regions comprised two stack-gate transistor regions and a selector region, in which each stack-gate transistor region comprises from top to bottom an elongated control-gate layer (CG0~CG7) being formed over an intergate dielectric layer 107b and a plurality of integrated floating-gate layer (IFG). A selector region being formed between two stack-gate transistor regions comprises a plurality of planarized conductive islands and a plurality of metal layers being simultaneously patterned and etched by a plurality of hard masking layers to form a plurality of select lines (WL0~WL3/BL0~BL3) being formed above the plurality of active regions and transversely to the plurality of elongated control-gate layers. According to the dual-bit flash memory cells as shown in FIG. 2A(a) and FIG. 2A(b), the dual-bit flash memory array shown in FIG. 2B implies two kinds of dual-bit flash memory cells, depending on the device structure in the selector region. The detailed cross-sectional views as indicated by B—B' line, C—C' line, and D—D' line can refer to FIG. 5A and FIG. 5B. As shown in FIG. 2B, the cell size of the present invention as masked by a dash square is $2(x+1)F^2$, where X is a scale factor and is in general $1 \leq X \leq 3$. For X=3, the area of an unit cell per bit is $4F^2$, which is a limiting cell size of an NAND-type array. Therefore, the dual-bit flash memory cells of the present invention can be easily used to implement a high-density flash memory array.

FIG. 2C(a) and FIG. 2C(b) show the schematic circuit diagrams of the present invention, in which FIG. 2C(a) shows a dual-bit flash memory array using a dual-bit flash memory cell shown in FIG. 2A(a) and FIG. 2C(b) shows a dual-bit flash memory array using a dual-bit flash memory cell in FIG. 2A(b). As shown in FIG. 2C(a), each unit cell as marked by the dash square comprises two stack-gate transistors and a select-gate transistor being connected to a word line; each stack-gate transistor has an elongated control-gate line (CG) and a bit line (BL) being formed by a common source conductive bus line. As shown in FIG. 2C(b), each unit cell as marked by the dash square comprises two stack-gate transistors and a selector region being formed by a planarized conductive island 126b on a common-drain diffusion region 123b; the planarized conductive islands 126b in a row is connected to a bit line (BL) and a source line (SL) is connected to the common-source diffusion region in a column through a common-source conductive bus line; and each stack-gate transistor has a control-gate line (CG). It is clearly seen that FIG. 2C(b) is the same as a miniaturized NOR-type array.

According to the above description, the advantages and the features of the present invention are summarized below:
(a) The dual-bit flash memory cells of the present invention offer a cell size per bit smaller than $4F^2$.
(b) The dual-bit flash memory cells of the present invention offer a high-speed erasing anode for erasing the stored electrons in the integrated floating-gate layer to a common-source conductive bus line.
(c) The dual-bit flash memory cells of the present invention offer a larger coupling ratio for a floating-gate layer using a self-aligned integrated floating-gate layer without enlarging the isolation area.
(d) The dual-bit flash memory array of the present invention offers a shallow-trench-isolation structure for the dual-bit flash memory cells in different columns or rows.
(e) The dual-bit flash memory array of the present invention offers a common-source conductive bus line with smaller bus-line resistance and capacitance as compared to those of a buried diffusion line.
(f) The dual-bit flash memory array of the present invention offers a better density·speed·power product as compared to a NAND-type array.

Figure 3A:
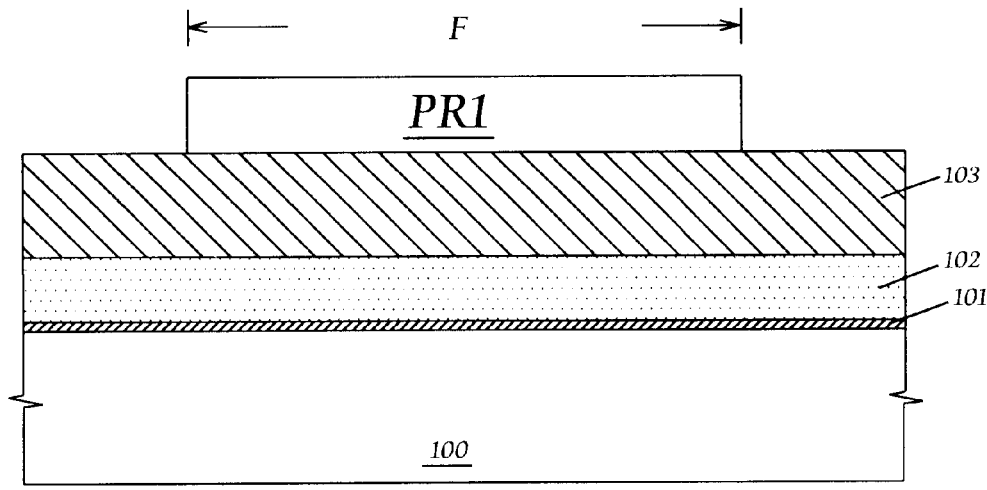
FIG. 3A through FIG. 3I show the process steps and their cross-sectional views for forming a shallow-trench-isolation structure for a dual-bit flash memory cell and its memory array of the present invention.

Referring now to FIG. 3A through FIG. 3I, there are shown the process steps and their cross-sectional views for fabricating a shallow-trench-isolation (STI) structure having an integrated floating-gate layer for a dual-bit flash memory cell and its memory array of the present invention. As shown in FIG. 3A, a thin tunneling-dielectric layer 101 is formed on a semiconductor substrate 100 of a first conductivity type; a first conductive layer 102 is formed over the thin tunneling-dielectric layer 101; a first masking dielectric layer 103 is formed over the first conductive layer 102; and a patterned masking photoresist PR1 is formed on the first masking dielectric layer 103 to define an active region (under PR1). The thin tunneling-dielectric layer 101 is preferably a thermal-oxide layer or a nitrided thermal-oxide layer and its thickness is preferably between 60 Angstroms and 150 Angstroms. The first conductive layer 102 is preferably a doped polycrystalline-silicon or doped amorphous-silicon layer deposited by low-pressure chemical-vapor-deposition (LPCVD) technique and its thickness is preferably between 1000 Angstroms and 3000 Angstroms. The first masking dielectric layer 103 is preferably made of silicon-nitrides as deposited by LPCVD and its thickness is preferably between 500 Angstroms and 3000 Angstroms. It should be noted that FIG. 3A shows only a small portion of the semiconductor substrate 100 and actually a plurality of patterned masking photoresist PR1 are formed to define a plurality of active regions (under PR1). The width and the space of the patterned masking photoresist PR1 can be a minimum-feature-size F of technology used, as indicated in FIG. 3A.

Figure 3B:
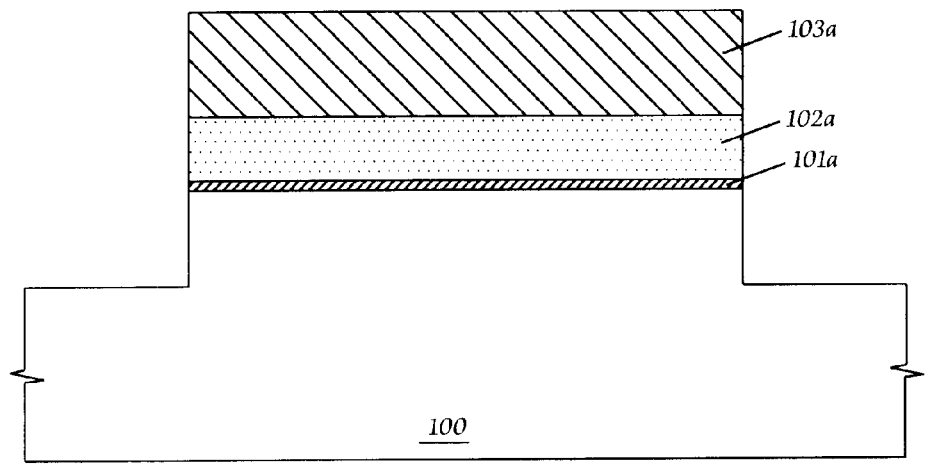

FIG. 3B shows that the first masking dielectric layer 103, the first 25 conductive layer 102, the thin tunneling-dielectric layer 101, and the semiconductor substrate 100 outside of the patterned masking photoresist PR1 are selectively etched to form the shallow trenches in the semiconductor substrate 100 and the patterned masking photoresist PR1 are stripped.

Figure 3C:
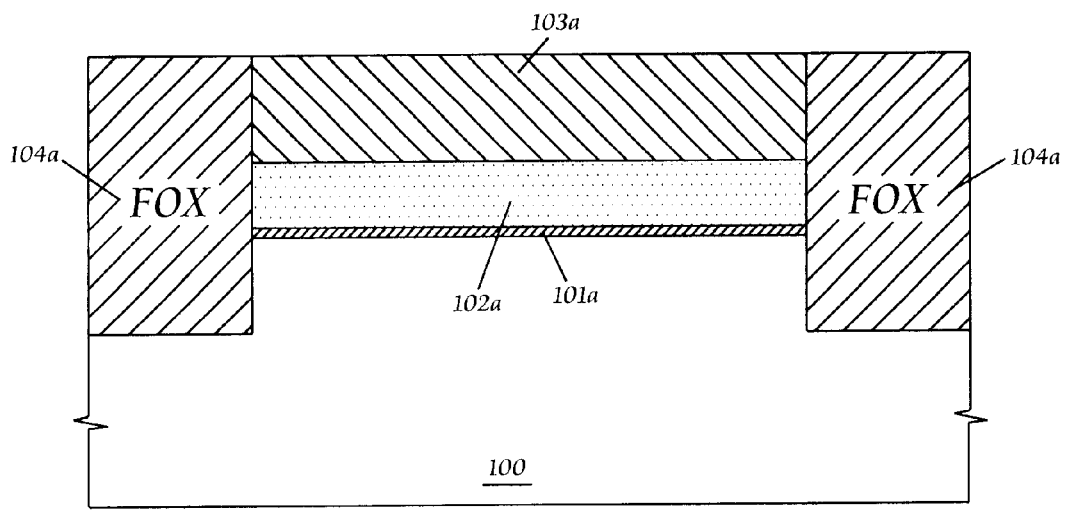

FIG. 3C shows that the planarized field-oxide layers 104a are formed over the shallow trenches. The planarized field-oxide layers 104a are formed by first depositing a thick field-oxide film 104 to fill up the gaps formed by the trench etchings and then planarizing the deposited field-oxide film 104 using chemical-mechanical polishing (CMP) with the first masking dielectric layer 103a as a polishing stop. The planarized field-oxide layer 104a is preferably made of silicon-oxides or phosphosilicate glass (PSG) and is preferably deposited by CVD or high-density plasma CVD.

Figure 3D:
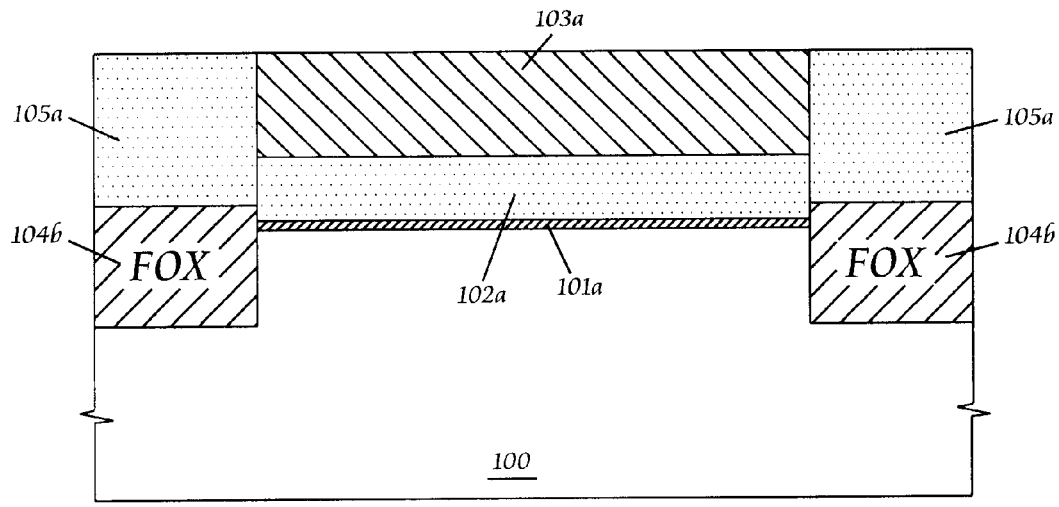

FIG. 3D shows that the planarized field-oxide layers 104a are etched back to a level approximately equal to a two-third thickness of the first conductive layer 102a and the planarized second conductive layers 105a are formed to fill up the etched-back gaps. The planarized second conductive layers 105a are formed by first depositing a thick second conductive layer 105 and then planarizing the deposited thick second conductive layer 105 using CMP with the first masking dielectric layer 103a as a polishing stop. The planarized second conductive layer 105a is preferably made of doped polycrystalline-silicon or doped amorphous-silicon.

Figure 3E:
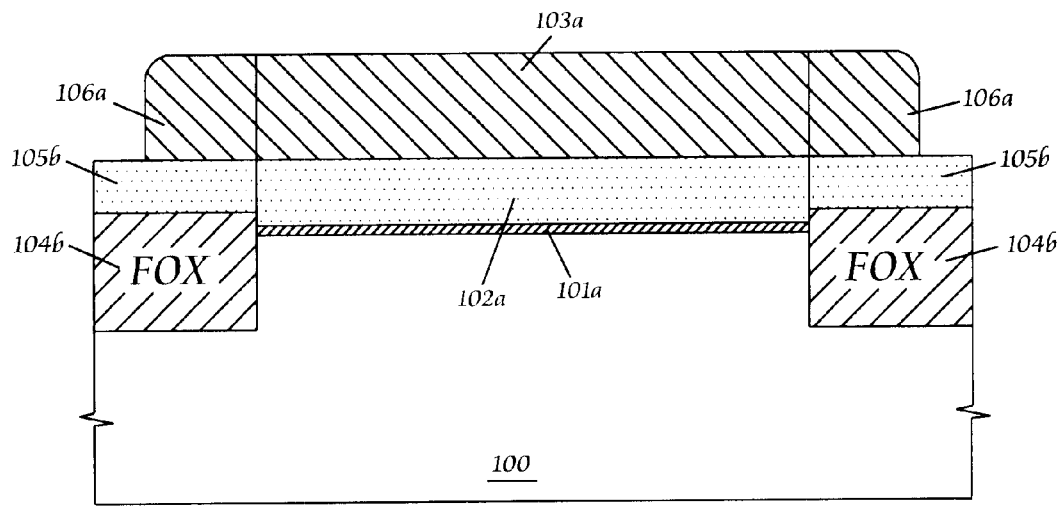

FIG. 3E shows that the planarized second conductive layers 105a are etched back to a depth approximately equal to a thickness of the first masking dielectric layer 103a and a first dielectric spacer 106a is formed over the sidewalls of the first masking dielectric layer 103a. The first dielectric spacer 106a is preferably made of silicon-nitrides deposited by LPCVD and is formed by first depositing a dielectric layer 106 and then etching back the thickness of the deposited dielectric layer 106. The spacer width of the first dielectric spacer 106a is mainly determined by the thickness of the deposited dielectric layer 106 and is therefore controllable.

Figure 3F:
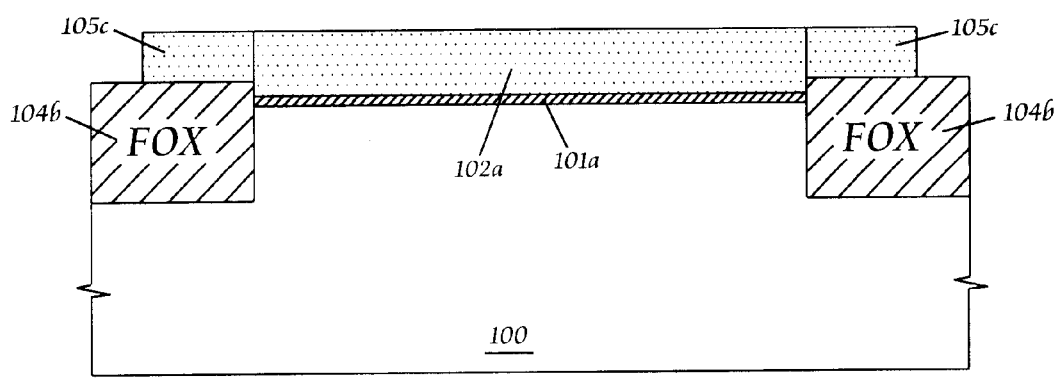

FIG. 3F shows that the etched-back second conductive layers 105b are selectively etched by using the first masking dielectric layers 103a and the first dielectric spacers 106a as an etching mask and then the first masking dielectric layers 103a and the first dielectric spacers 106a are removed by preferably using hot-phosphoric acid. It is clearly seen that a first conductive layer 102a and two extended second conductive layers 105c are integrated to form an integrated floating-gate layer and the coupling ratio of the floating-gate layer will be largely increased without increasing the masking photoresist steps and enlarging the isolation region. It should be emphasized that the STI isolation structure shown in FIG. 3F is only an example but not exclusive for implementing a dual-bit flash memory cell and its memory array of the present invention as will be disclosed later.

Figure 3G:
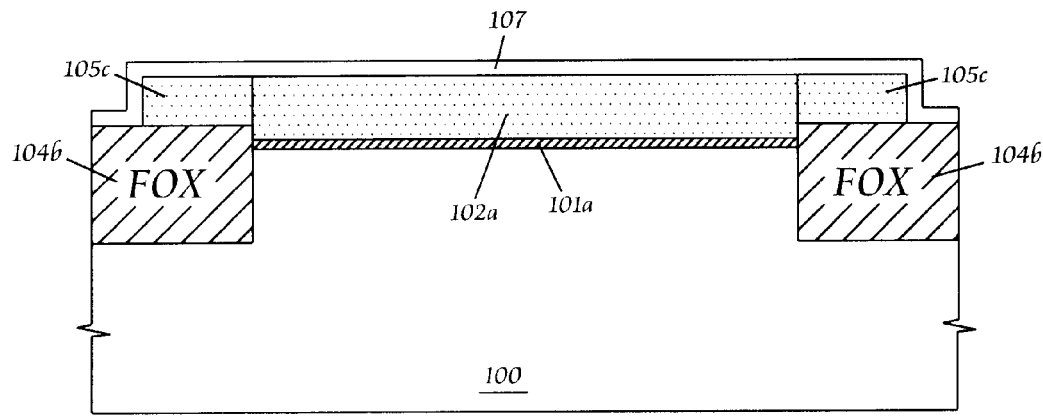

FIG. 3G shows that an intergate dielectric layer 107 is formed over the integrated floating-gate layers and the raised field-oxide layers 104b. The intergate dielectric layer 107 is preferably a composite dielectric layer such as an oxide-nitride-oxide (ONO) structure or a nitride-oxide structure and its equivalent silicon-oxide thickness is between 60 Angstroms and 150 Angstroms.

Figure 3H:
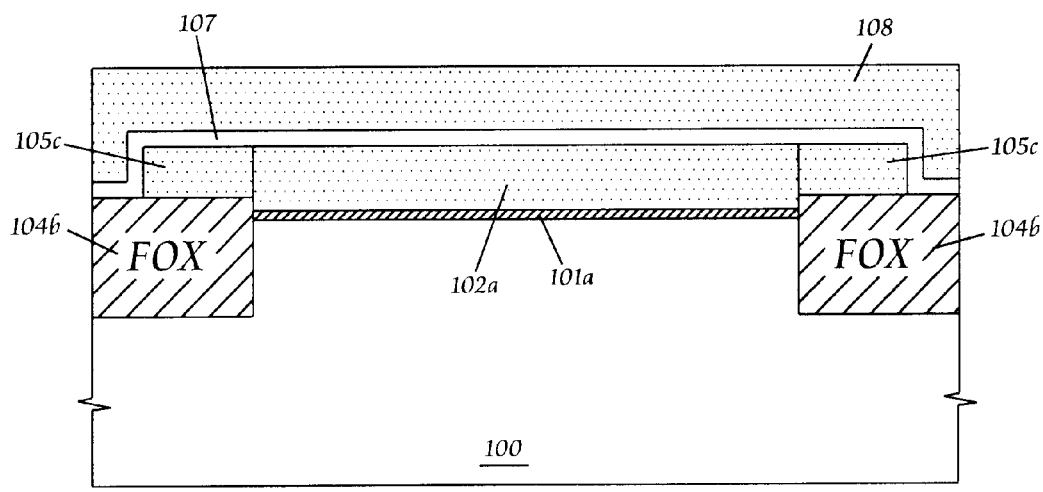

FIG. 3H shows that a third conductive layer 108 is formed over the intergate dielectric layer 107. The third conductive layer 108 is preferably made of doped polycrystalline-silicon or doped polycrystalline-silicon capped with a tungsten-silicide layer (polycide) and its thickness is between 2000 Angstroms and 5000 Angstroms.

Figure 3I:
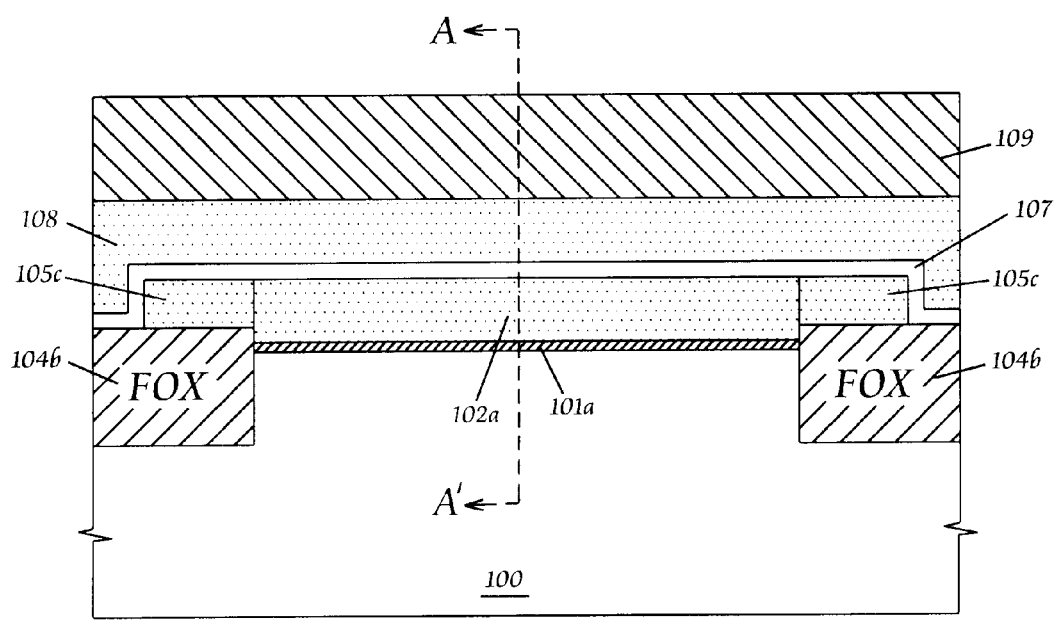

FIG. 3I shows that a second masking dielectric layer 109 is formed over the third conductive layer 108. The second masking dielectric layer 109 is preferably made of silicon-nitrides as deposited by LPCVD and its thickness is preferably between 1000 Angstroms and 5000 Angstroms. It is clearly seen that the surface morphology is quite flat for fine-line lithography.

Figure 4A:
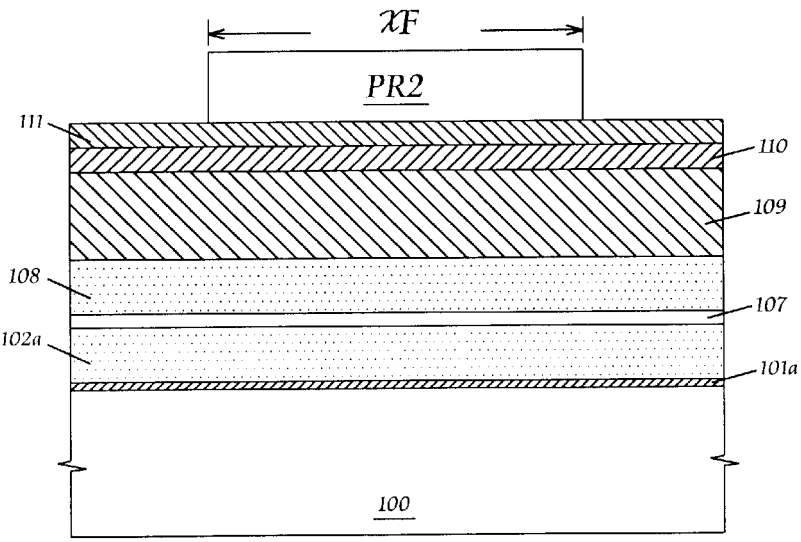
FIG. 4A through FIG. 4J show the process steps and their cross-sectional views for forming the dual-bit flash memory cells and their memory arrays of the present invention.

Referring now to FIG. 4A through FIG. 4J, there are shown the process steps and their cross-sectional views for fabricating a dual-bit flash memory cell and its memory array on a shallow-trench-isolation (STI) structure shown in FIG. 3I. As shown in FIG. 4A, a sacrificial masking silicon-oxide layer 110 is formed over the second masking dielectric layer 109 as shown in FIG. 3I along A—A' direction and then a sacrificial masking silicon-nitride layer 111 is formed over the sacrificial masking silicon-oxide layer 110. The patterned masking photoresist PR2 are formed over the sacrificial masking silicon-nitride layer 111 to define a plurality of gate regions (under PR2). The sacrificial masking silicon-oxide layer 110 is preferably deposited by LPCVD and its thickness is preferably between 200 Angstroms and 1000 Angstroms. The sacrificial silicon-nitride layer 111 is preferably deposited by LPCVD and its thickness is preferably between 200 Angstroms and 1000 Angstroms. As shown in FIG. 4A, the width of the patterned masking photoresist PR2 is XF and is scalable with $1 \leq X \leq 3$ and the space between the patterned masking photoresist PR2 can be a minimum-feature-size F.

Figure 4B:
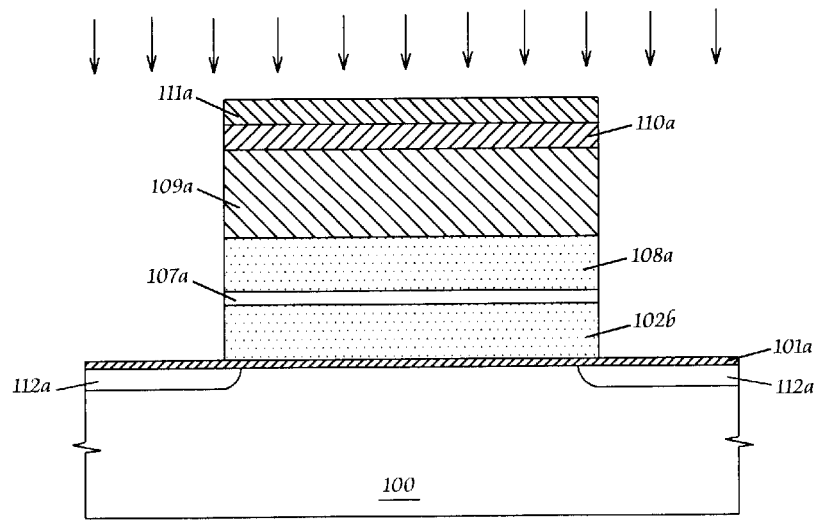

FIG. 4B shows that the sacrificial masking silicon-nitride layer 111, the sacrificial masking silicon-oxide layer 110, the second masking dielectric layer 109, the third conductive layer 108, the intergate dielectric layer 107, and the extended second conductive layer 105c are selectively removed and the first conductive layer 102b are partially etched (not shown), the raised field-oxide layer 104b are then etched to a level slightly higher than the top level of the thin tunneling-dielectric layer 101a and, subsequently, the remained first conductive layer is removed to form a plurality of common bus-line regions. An ion-implantation is performed in a self-aligned manner after stripping the patterned masking photoresist PR2 to form a plurality of common-source diffusion regions 112a of a second conductivity type in the plurality of active regions along the plurality of common bus-line regions. The implanted doping impurities are preferably phosphorous and the dose is between $10^{14}/cm^2$ and $10^{15}/cm^2$ for forming the lightly-doped common-source diffusion regions 112a in the semiconductor substrate 100.

Figure 4C:
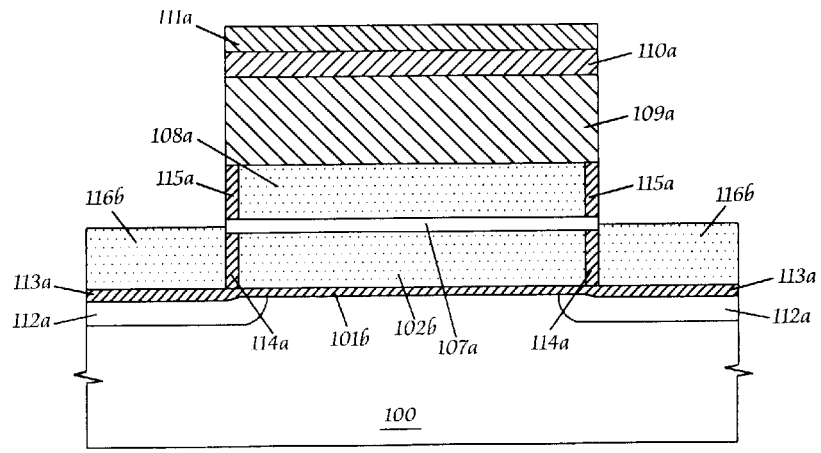

FIG. 4C shows that the thin tunneling-dielectric layer 101a is removed and the etched raised field-oxide layer 104c is slightly etched by dipping in a dilute hydroflouric acid and a thermal oxidation is performed to form a first poly-oxide layer 115a over the sidewalls of the third conductive layer 108a, a second poly-oxide layer 114a over the sidewalls of the first conductive layer 102b and the extended second conductive layer 105d (not shown), and a thermal oxide layer 113a over the common-source diffusion regions 112a. Then, a planarized fourth conductive layer 116a is formed over the common-source bus-line regions (not shown) and is etched back to a level approximately equal to the middle of the intergate dielectric layer 107a to form a planarized fourth conductive layer 116b as shown in FIG. 4C. The planarized fourth conductive layer 116a is preferably made of doped polycrystalline-silicon or doped amorphous-silicon as deposited by LPCVD and is formed by first depositing a thick fourth conductive layer 116 to fill up the gaps formed in the common-source bus-line regions and then planarizing the deposited thick fourth conductive layer 116 using CMP with the sacrificial masking silicon-nitride layer 111a as a polishing stop.

Figure 4D:
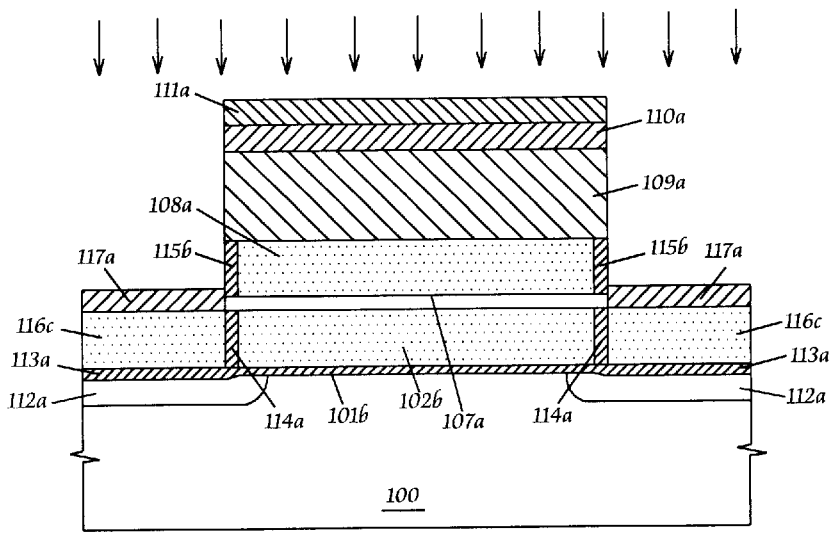

FIG. 4D shows that the planarized fourth conductive layer 116b is oxidized to form a third poly-oxide layer 117a, in which the first poly-oxide layer 115a becomes thicker as indicated by 115b and the planarized conductive layer 116b becomes thinner as indicated by 116c. Ion-implantation can be performed across the third poly-oxide layer 117a to heavily dope the planarized fourth conductive layer 116c if required.

Figure 4E:
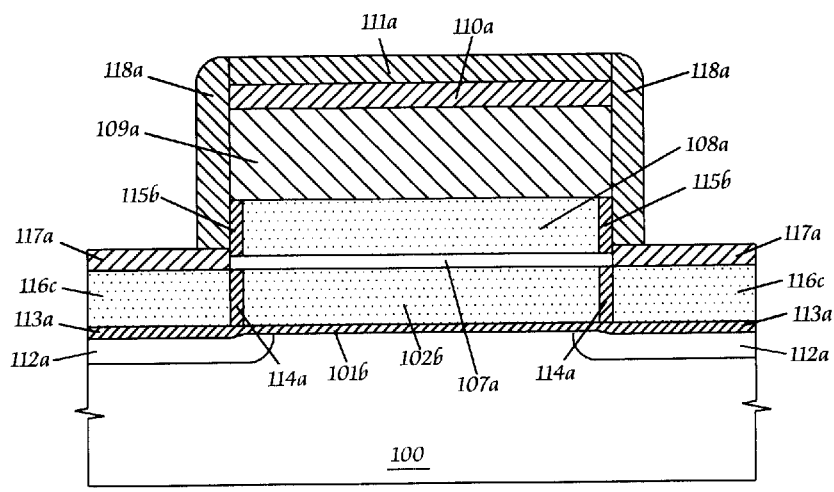

FIG. 4E shows that a second dielectric spacer 118a is formed over the sidewalls of the gate regions and on the third poly-oxide layer 117a. The second dielectric spacer 118a is preferably made of silicon-nitrides as deposited by LPCVD.

Figure 4F:
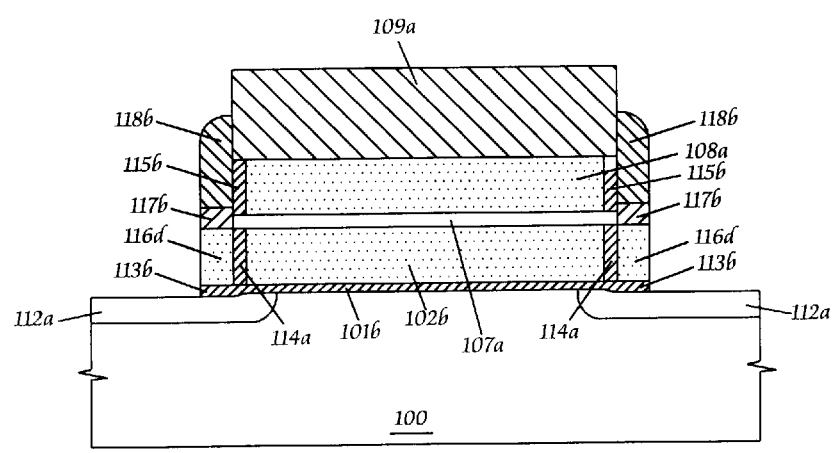

FIG. 4F shows that the second dielectric spacer 118a is etched back to a level approximately equal to a half-thickness of the second masking dielectric layer 109a and the sacrificial masking silicon-nitride layer 111a is simultaneously removed; the third poly-oxide layer 117a, the sacrificial masking silicon-oxide layer 110a, the planarized fourth conductive layer 116c and the thermal-oxide layer 113a are selectively removed by using the second dielectric spacers 118b and the second masking dielectric layer 109a as an etching mask. It should be noted that a flat bed is formed between a pair of second dielectric-spacer structures and is alternately formed by the common-source diffusion regions 112a and the etched raised field-oxide layers 104c along the common-source bus-line region.

Figure 4G:
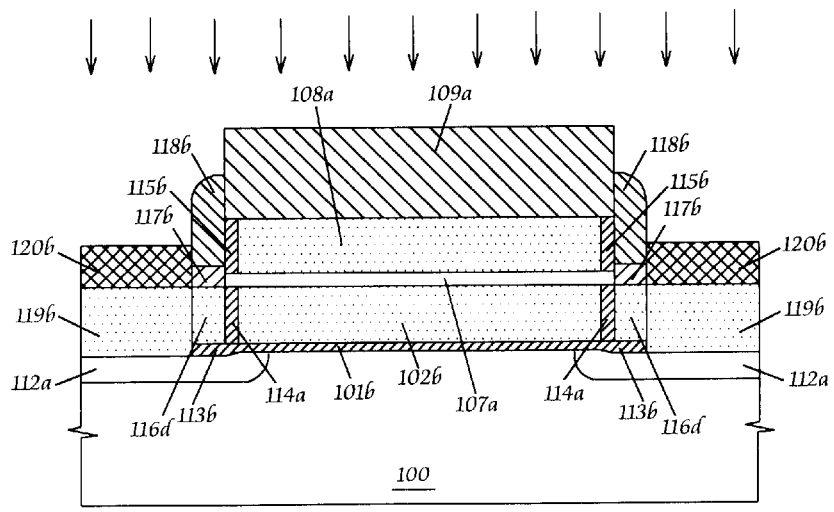

FIG. 4G shows that a planarized fifth conductive layer 119b is formed over the flat bed between the pair of second dielectric-spacer structures and a silicide layer 120b is formed over the planarized fifth conductive layer 119b. The planarized fifth conductive layer 119b is preferably made of doped polycrystalline-silicon as deposited by LPCVD and is formed by first depositing a thick fifth conductive layer 119 to fill up the gaps formed along the common-source bus-line region, then planarizing the deposited thick fifth conductive layer 119 using CMP with the second masking dielectric layer 109a as a polishing stop and, subsequently, etching back the planarized fifth conductive layer 119a. The silicide layer 120b can be formed by a method as described for the planarized fifth conductive layer 119b or using a self-aligned silicidation technique. The silicide layer 120b is preferably made of tungsten-silicides or other high melting-point silicides. It is clearly seen that two planarized fourth conductive layers 116d and a planarized fifth conductive layer 119b are integrated to form an integrated conductive bus line having two conductive erasing anodes 116d formed over the sidewalls of the plurality of integrated floating-gate layers along each of common-source bus-line regions and the second poly-oxide layer 114a is acted as a tunneling-dielectric layer. FIG. 4G shows that an ion-implantation can be performed to heavily dope the planarized fifth conductive layers 119b to be acted as a dopant diffusion source for forming a heavily-doped diffusion region 124a within a common-source diffusion region 112a. The implanted doping impurities are preferably arsenic and the dose is preferably between $10^{15}/cm^2$ and $5\times10^{15}/cm^2$.

Figure 4H:
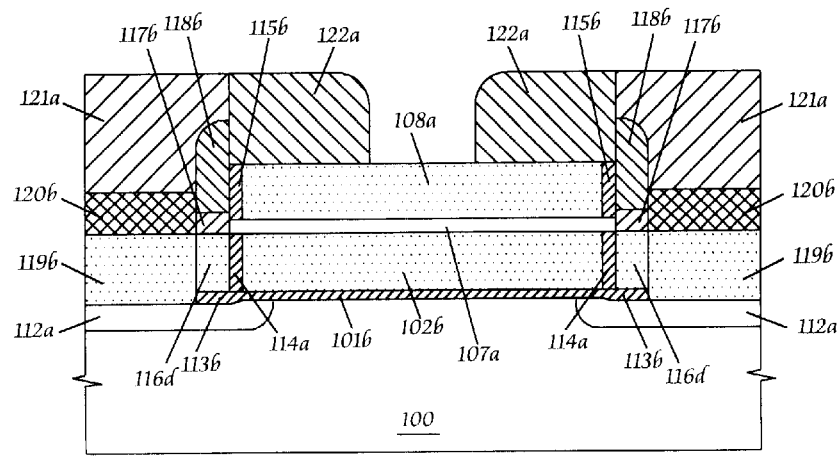

FIG. 4H shows that a planarized thick-oxide layer 121a is formed over the silicide layer 120b and the second dielectric spacers 118b and is formed by first depositing a thick silicon-oxide layer 121 to fill up the gaps along the common-source bus-line regions and then planarizing the deposited thick silicon-oxide layer 121 using CMP with the second masking dielectric layer 109a as a polishing stop. The planarized thick silicon-oxide layer 121 is preferably deposited by CVD or HDPCVD. The second masking dielectric layers 109a are then removed preferably by anisotropic dry etching and two third dielectric spacers 122a are formed over the sidewalls formed by the removed second masking dielectric layer 109a in a gate region. The third dielectric spacer 122a is preferably made of siliconoxides or silicon-nitrides as deposited by LPCVD.

Figure 4I:
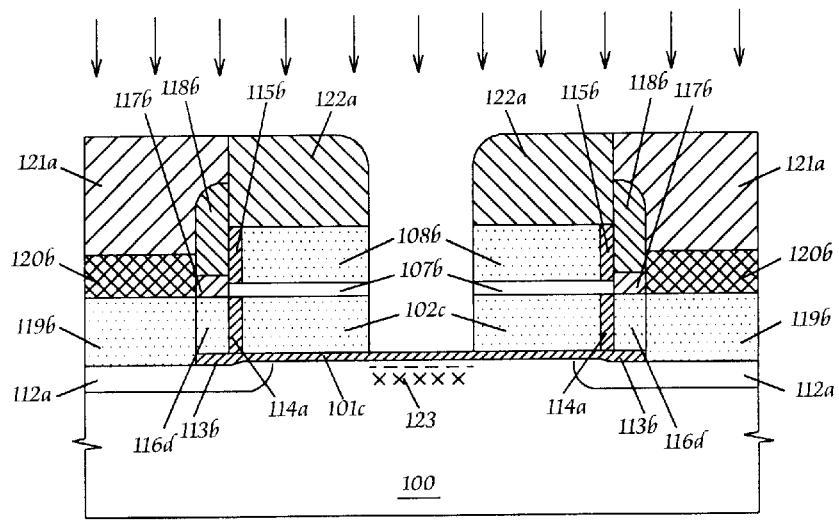
Figure 4I:
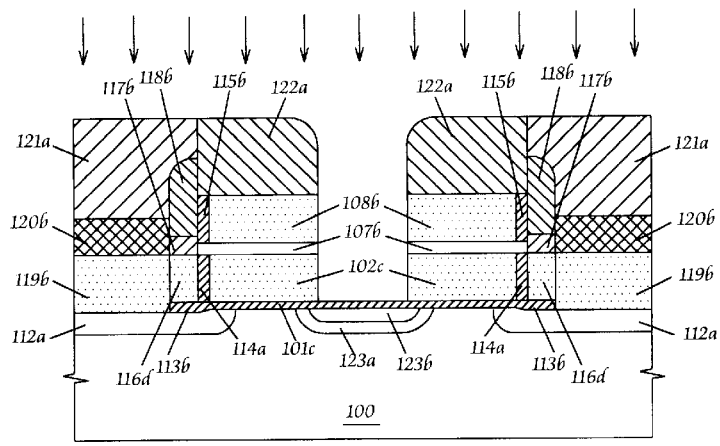

FIG. 4I(a) shows that the third conductive layer 108a, the intergate dielectric layer 107a, the extended second conductive layers 105c, and the first conductive layers 102b between the third dielectric spacers 122a in a gate region are selectively removed. It should be noted that the raised field-oxide layers 104b between the third dielectric spacers 122a can be slightly etched to a level approximately equal to a top level of the thin tunneling-dielectric layer 101c to obtain a relatively flat surface for selector region. An ion-implantation is performed in a self-aligned manner to form an implanted region 123 of a first conductivity type in the surface region of the semiconductor substrate 100, in which a shallow implant region as masked by a dash line is mainly used to adjust the threshold-voltage of the select-gate transistor and is preferably formed by implanting boronfluoride ($BF_2$) impurities; a deep implant region as marked by the cross symbols is mainly used to form a punch-through stop and is preferably formed by implanting boron impurities.

Figure 4J:
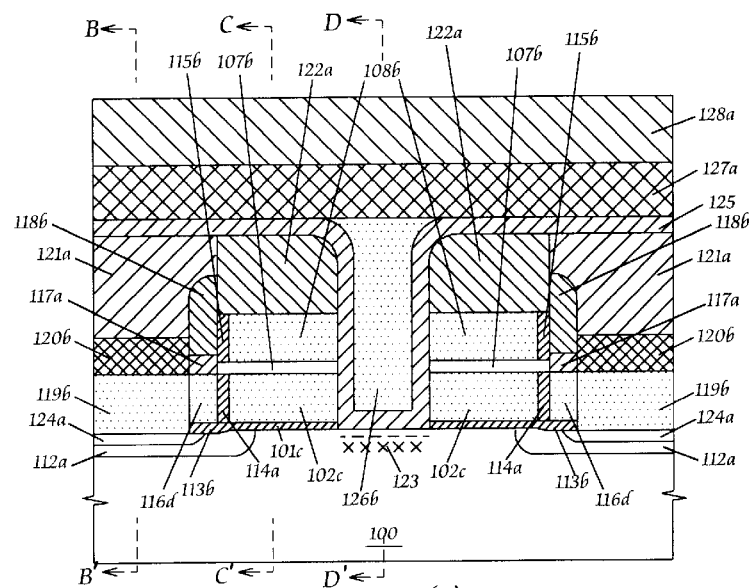
Figure 4J:
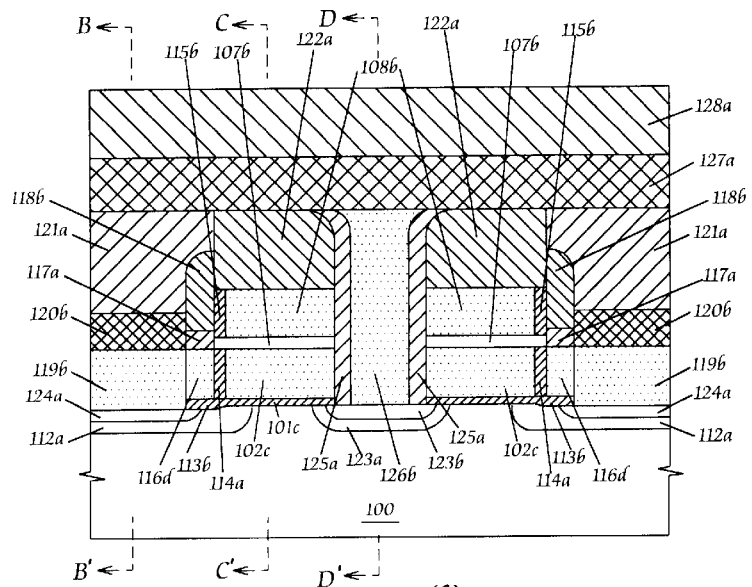
Figure 5A:
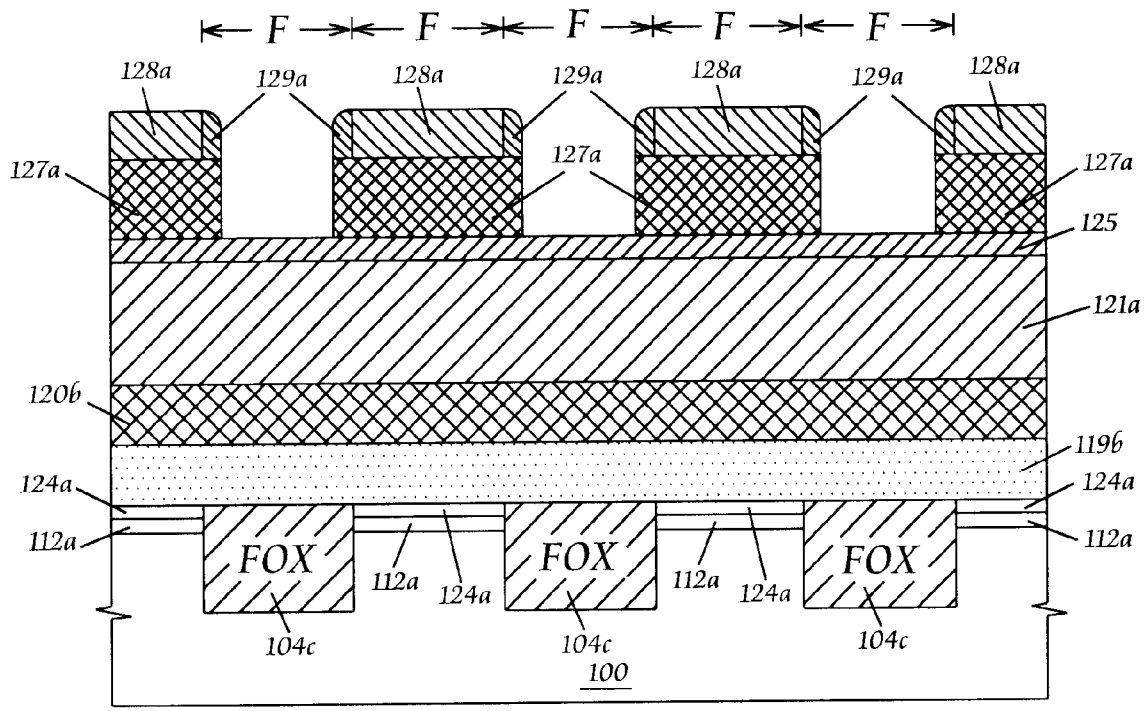
FIG. 5A and FIG. 5B show the various cross-sectional views of the dual-bit flash memory cells and their memory arrays shown in FIG. 4J(a) and FIG. 4J(b), in which FIG. 5A(a) through FIG. 5A(c) show the cross-sectional views along B—B', C—C' and D—D' lines as indicated in FIG. 4J(a), respectively.
Figure 5A:
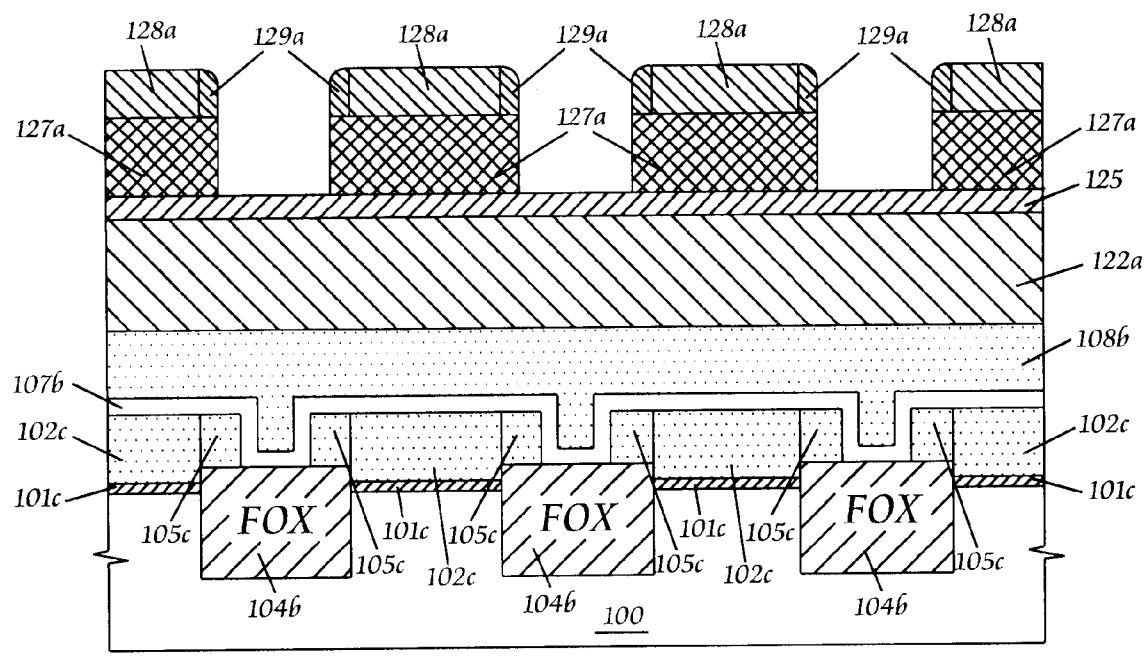
Figure 5A:
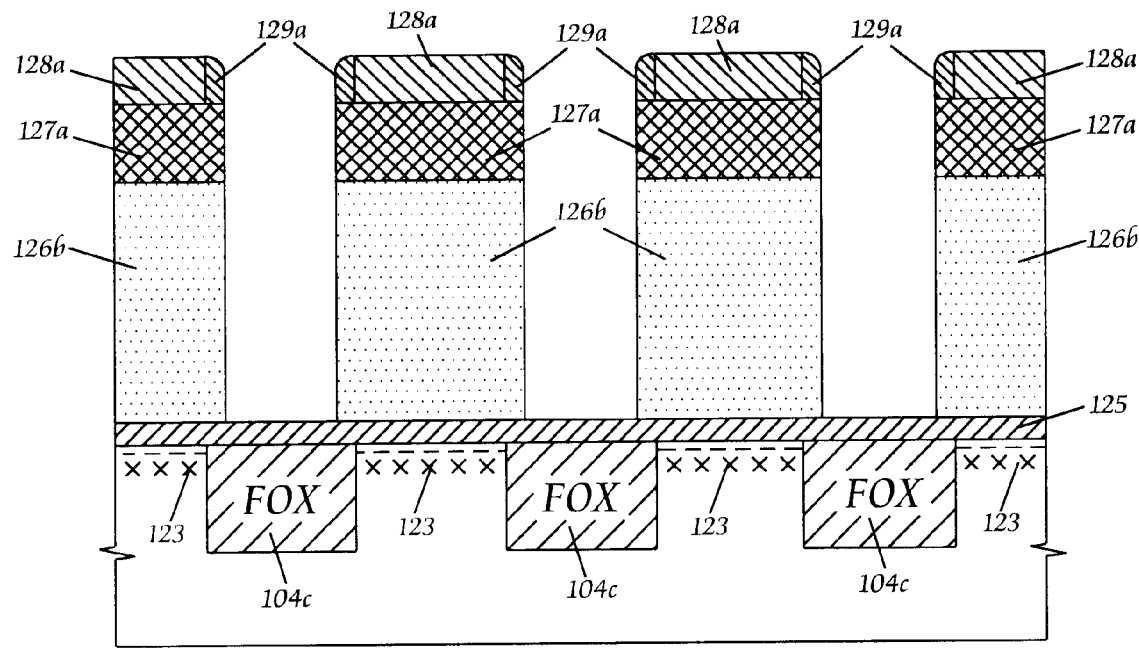

FIG. 4J(a) shows that the thin tunneling-dielectric layers 101c between two stack-gate transistor regions in a gate region are removed and the etched raised field-oxide layers are etched by dipping in a dilute hydrofluoric acid and a gate-dielectric layer 125 is then formed over the structure. A planarized fifth conductive layer 126a is subsequently formed over the gate-dielectric layer 125 to fill up the gap between two stack-gate transistor regions in a gate region and a metal layer 127 is formed over the gate-dielectric layer 125 and the planarized fifth conductive layers 126a, then a plurality of hard masking layers are formed over the metal layer 127 to simultaneously pattern and etch the metal layer 127 and the planarized fifth conductive layers 126a to form a plurality of word lines above the plurality of active regions and transversely to the plurality of gate regions. As shown in FIG. 4J(a), a patterned third masking dielectric layer 128a and its two sidewall dielectric spacers 129a (as shown in FIG. 5A(*a*) through 5A(*c*)) are formed over a patterned metal layer 127*a* together with the patterned planarized fifth conductive islands 126*b* to form a word line (or a select line). The gate-dielectric layer 125 is preferably a silicon-oxide layer or a composite dielectric layer such as a nitride-oxide structure or an oxide-nitride-oxide (ONO) structure and its equivalent silicon-oxide thickness is preferably between 150 Angstroms and 500 Angstroms. The planarized fifth conductive layer 126*a* is preferably made of doped polycrystalline-silicon or metal materials. If the planarized doped polycrystalline-silicon layer is used as the planarized fifth conductive layer 126*a*, a refractory-metal silicide layer is formed on the planarized doped polycrystalline-silicon layer by a well-known self-aligned silicidation process. If a metal layer such as tungsten or tungsten-silicides is used as the planarized fifth conductive layer 126*a*, a barrier-metal layer such as titanium-nitrides (TiN) or tantalum-nitrides (TaN) is suggested to form over the gate-dielectric layer 125 first. The metal layer 127*a* is preferably made of aluminum or copper formed on a barrier-metal layer such as TiN or TaN. The hard masking layer including a third masking dielectric layer 128*a* and its two sidewall dielectric spacers 129*a* is preferably made of silicon-nitrides or silicon-oxides as deposited by LPCVD. The cross-sectional views along various regions shown in FIG. 4J(*a*) will be discussed later. FIG. 4J(*a*) shows that a dual-bit flash memory cell in a memory array comprises: two stack-gate transistors separated by a select-gate transistor being formed in a gate region; two common conductive bus lines acting as the bit-lines being formed in each side portion of the gate region; and a word line (or select line) being electrically integrated with the planarized fifth conductive island, which forms the first embodiment of the present invention.

Now returning to FIG. 4I(*b*), it shows that the same etching processes shown in FIG. 4I(*a*) are performed and an ion-implantation is then performed in a self-aligned manner to form a plurality of common-drain diffusion regions in the semiconductor substrate 100 of a plurality of active regions between two stack-gate transistor regions of each gate region. The doping profile in the common-drain diffusion region can be a double-diffused structure as shown in FIG. 4I(*b*), in which a heavily-doped diffusion region of a second conductivity type 123*b* is formed within a moderately-doped diffusion region of a first conductivity type 123*a*. The doping profile in the common-drain diffusion region can be a heavily-doped diffusion region of a second conductivity type. The major purpose of the doping profile control is mainly to tailor the lateral electric field near the drain in order to enhance hot-electron-injection efficiency.

Figure 5B:
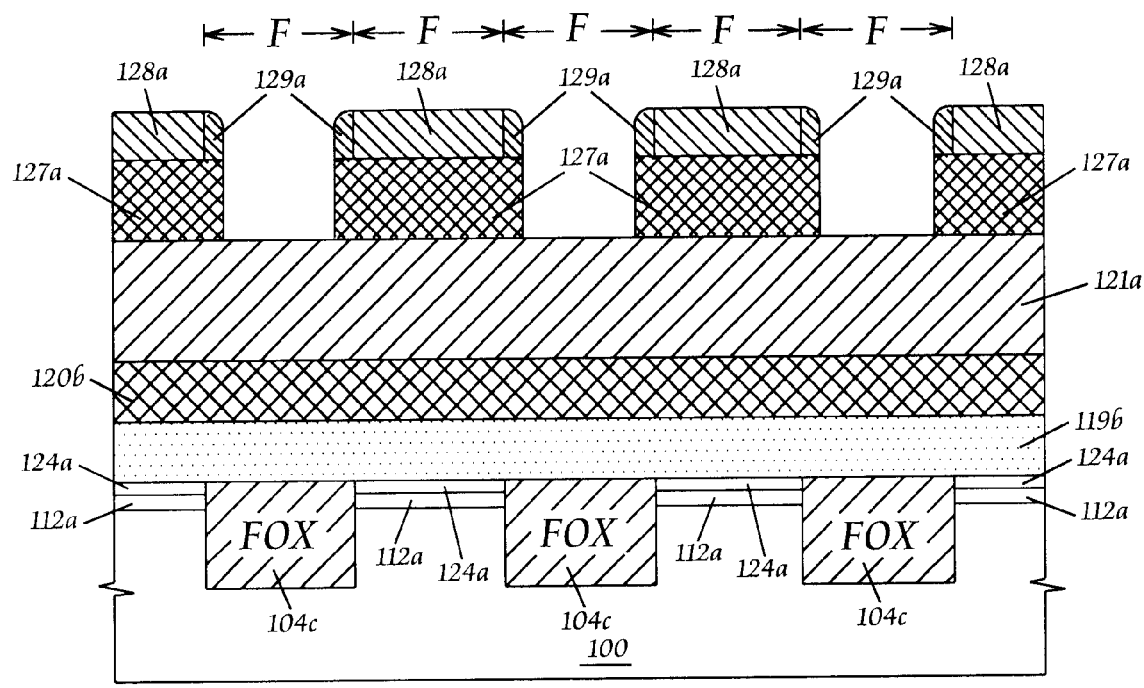
Figure 5B:
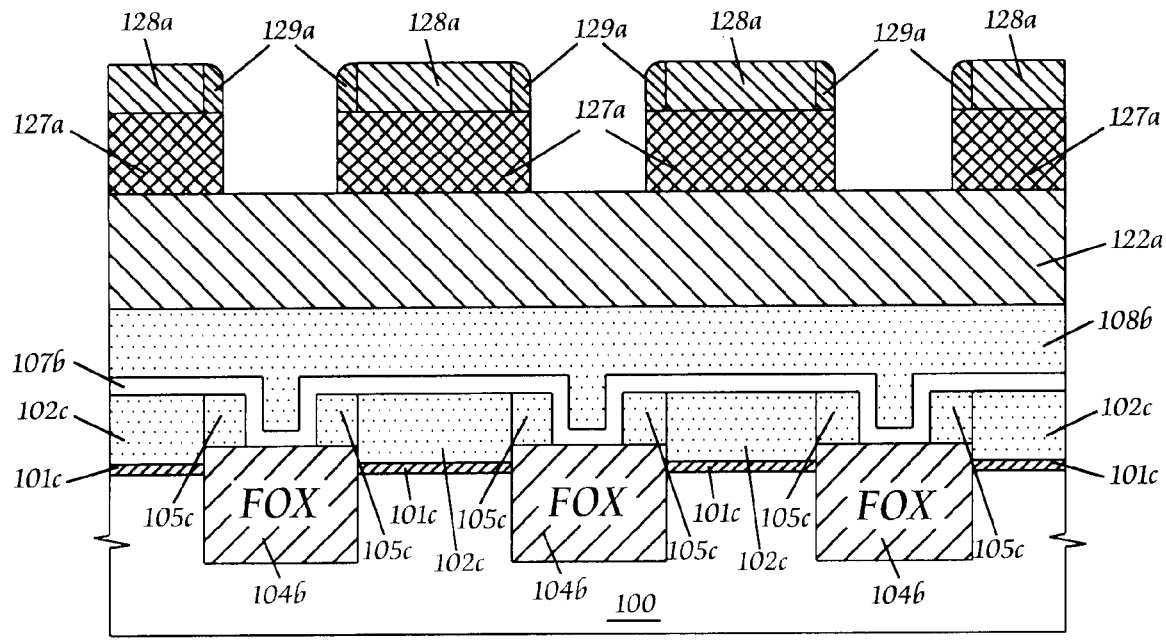
Figure 5B:
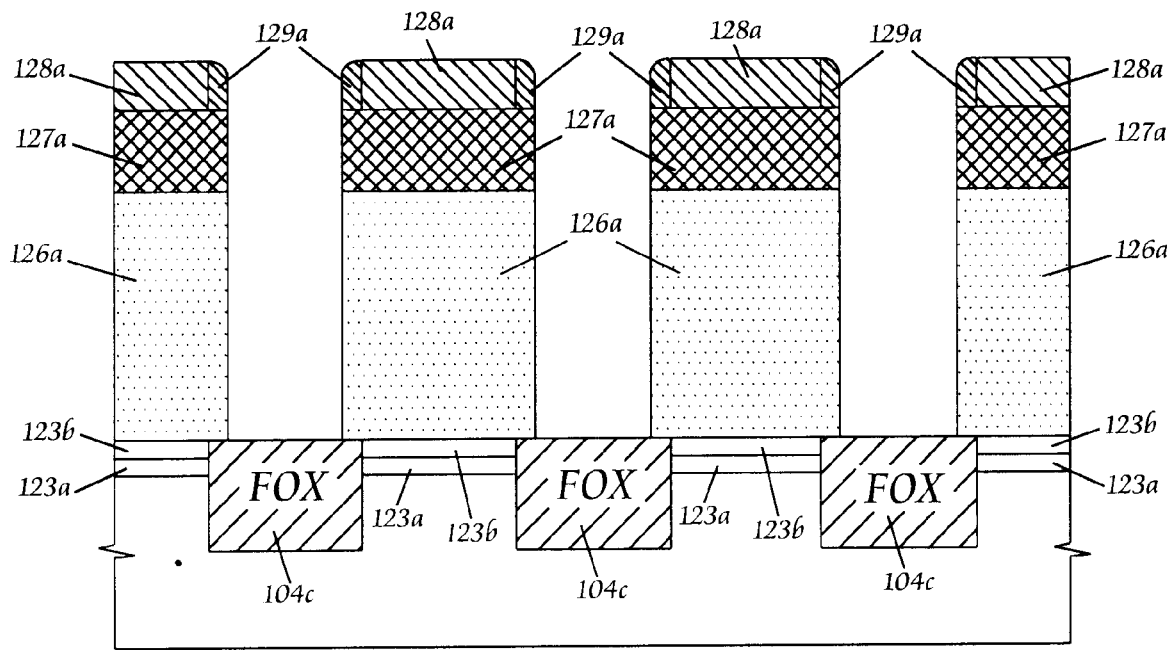

FIG. 4J(*b*) shows that the thin tunneling-dielectric layers 101*c* are removed and the etched raised field-oxide layers 104*c* between two stack-gate transistor regions are etched by dipping in a dilute hydrofluoric acid; subsequently, a pair of fourth dielectric spacers 125*a* are formed over the inner sidewalls of two stack-gate transistor regions in each gate region and a planarized fifth conductive layer 126*a* is then formed over the pair of fourth dielectric spacers 125*a* and on a second flat bed being alternately formed by the heavily-doped drain diffusion region 123*b* and the etched raised field-oxide layers 104*c*. Similarly, a metal layer 127 is formed over the formed array structure and a plurality of hard masking layers are formed over the metal layer 127 to simultaneously pattern and etch the metal layer 127 and the planarized fifth conductive layers 126*a* to form a plurality of bit lines above the plurality of active regions and transversely to the plurality of gate regions. As shown in FIG. 4J(*b*), a patterned third masking dielectric layer 128*a* and its two sidewall dielectric spacers 129*a* (as shown in FIG. 5B(*a*) through FIG. 5B(*c*)) are formed over a patterned metal layer 127*a* together with the patterned planarized fifth conductive islands 126*b* to form a bit line (or a select line).

The fourth dielectric spacer 125*a* is preferable made of silicon-oxides or silicon-nitrides as deposited by LPCVD and its spacer width is preferably between 200 Angstroms and 1000 Angstroms. The planarized fifth conductive layer 126*a* is preferably made of doped polycrystalline-silicon or metal materials. If the doped polycrystalline-silicon layer is used as the planarized fifth conductive layer 126*a*, a refractory-metal silicide layer is formed on the planarized doped polycrystalline-silicon layer by using a well-known self-aligned silicidation process. If a metal layer such as tungsten or tungsten-silicides is used as the planarized fifth conductive layer 126*a*, a barrier-metal layer such as titanium-nitrides (TiN) or tantalum-nitrides (TaN) is deposited over the formed structure before forming the planarized metal layer 126*a*. The metal layer 127*a* is preferably made of aluminum or copper formed on a barrier-metal layer such as TiN or TaN. The hard masking layer including a third masking dielectric layer 128*a* and its two sidewall dielectric spacers 129*a* is preferably made of silicon-nitrides or silicon-oxides as deposited by LPCVD. The cross-sectional views along various regions shown in FIG. 4J(*b*) will be discussed later. FIG. 4J(*b*) shows that a dual-bit flash memory cell in a memory array comprises: two stack-gate transistors separated by a planarized fifth conductive island being formed on a common-drain diffusion region in a gate region; two common-source bus lines being formed in each side portion of the gate region; and a bit line being electrically integrated with the planarized fifth conductive island, which forms the second embodiment of the present invention.

Referring now to FIG. 5A(*a*) through FIG. 5A(*c*), there are shown various cross-sectional views of a dual-bit flash memory cell shown in FIG. 4J(*a*), in which FIG. 5A(*a*) shows a cross-sectional view along B—B' direction as indicated in FIG. 4J(*a*); FIG. 5A(*b*) shows a cross-sectional view along C—C' direction as indicated in FIG. 4J(*a*); and FIG. 5A(*c*) shows a cross-sectional view along D—D' direction as indicated in FIG. 4J(*a*). As shown in FIG. 5A(*a*), a common conductive bus-line including a silicide layer 120*b* formed over a planarized fifth conductive layer 119*b* is formed over a flat bed being alternately formed by the etched raised field-oxide layer 104*c* and the heavily-doped diffusion region 124*a*; a planarized thick-oxide layer 121*a* is formed over the silicide layer 120*b* and a gate-dielectric layer 125 is formed over the planarized thick-oxide layer 121*a*; a plurality of word lines (or select lines) are formed above the plurality of active regions and on the gate-dielectric layer 125 and are patterned and etched by a plurality of hard masking layers with each hard masking layer being formed by a third masking dielectric layer 128*a* and its two sidewall dielectric spacers 129*a*.

FIG. 5A(*b*) shows that an integrated floating-gate layer includes a major floating-gate layer 102*c* being formed over the thin tunneling-dielectric layer 101*c* and two extended floating-gate layers 105*c* being formed on a portion of nearby raised field-oxide layers 104*b*; an intergate dielectric layer 107*b* is formed over a plurality of integrated floating-gate layers and the raised field-oxide layers 104*b*; an elongated control-gate layer 108*b* is formed over the intergate dielectric layer 107*b*; a third dielectric spacer 122*a* is formed over the elongated control-gate layer 108*b* and a gate-dielectric layer 125 is formed over the third dielectric spacer 122*a*; a plurality of word lines are formed above the plurality of active regions and on the gate-dielectric layer 125 and are patterned and etched by a plurality of hard masking layers with each hard masking layer being formed by a third masking dielectric layer 128*a* and its two sidewall dielectric spacers 129*a*.

FIG. 5A(*c*) shows that a plurality of word lines including the patterned metal layers 127*a* and the patterned fifth conductive islands 126*b* are formed on a gate-dielectric layer 125 and above the plurality of active regions, and each word line is patterned and etched by a hard masking layer including a third masking dielectric layer 128a and its two sidewall dielectric spacers 129a. It is clearly seen that the third masking dielectric layer 128a can be defined by a minimum-feature-size F and the sidewall dielectric spacer 129a is used to eliminate the misalignment of the patterned fifth conductive island 126b with respect to the active region. Moreover, the raised field-oxide layers 104b along the selector regions are etched to form a second flat bed being formed alternately by the etched raised field-oxide layers 104c and the implanted regions 123.

Referring now to FIG. 5B(a) through FIG. 5B(c), there are shown various cross-sectional views of a dual-bit flash memory cell shown in FIG. 4J(b), in which FIG. 5B(a) shows a cross-sectional view along B—B' direction as indicated in FIG. 4J(b); FIG. 5B(b) shows a cross-sectional view along C—C' direction as indicated in FIG. 4J(b); and FIG. 5B(c) shows a cross-sectional view along D—D' direction as indicated in FIG. 4J(b). FIG. 5B(a) and FIG. 5B(b) are similar to FIG. 5A(a) and FIG. 5A(b) except that the gate-dielectric layer 125 in FIG. 5A(a) and FIG. 5A(b) is removed. Similarly, if the gate-dielectric layer 125 in FIG. 5A(c) is removed and the implanted regions 123 are replaced by the double-diffused regions 123b, 123a, then FIG. 5B(c) can be obtained. It is clearly seen that a plurality of bit lines including the patterned metal layers 127a and the patterned planarized fifth conductive islands 126a are formed over a second flat bed being alternately formed by the etched raised field-oxide layer 104c and the common-drain diffusion region 123b, 123a. Moreover, the sidewall dielectric spacer 129a is also used to eliminate the misalignment of the planarized fifth conductive island with respect to the common-drain diffusion region 123b, 123a.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A scalable dual-bit flash memory array, comprising:

a semiconductor substrate of a first conductivity type;

a plurality of parallel shallow-trench-isolation (STI) regions and a plurality of active regions being formed alternately on said semiconductor substrate, wherein each of the plurality of parallel STI regions is filled with a raised field-oxide layer;

a plurality of gate regions and a plurality of common bus-line regions being formed alternately over said semiconductor substrate and transversely to the plurality of parallel STI regions, wherein the plurality of gate regions are formed by a masking photoresist step and are therefore scalable;

a plurality of common-source diffusion regions of a second conductivity type being formed in said semiconductor substrate of the plurality of active regions along the plurality of common bus-line regions;

a first flat bed being formed between a pair of dielectric-spacer structures in each of the plurality of common bus-line regions and being alternately formed by said common-source diffusion region and a first etched raised field-oxide layer, wherein each of said dielectric-spacer structures is formed over each sidewall of said gate region and each of the plurality of common bus-line regions comprises from top to bottom a planarized thick-oxide layer being formed over said pair of dielectric-spacer structures, a silicide layer, and a common conductive bus-line formed over said first flat bed;

a stack-gate transistor region being formed in each side portion of said gate region and a selector region being formed between said stack-gate transistor regions, wherein said stack-gate transistor region comprises from top to bottom a sidewall dielectric spacer being formed over a nearby sidewall of said common bus-line region, an elongated control-gate layer being formed over an intergate dielectric layer, and a plurality of integrated floating-gate layers, and said selector region comprises a plurality of planarized conductive islands being formed over a second flat bed above the plurality of active regions; and a plurality of select lines being formed alternately above the plurality of active regions and transversely to the plurality of parallel STI regions and electrically connected to the plurality of planarized conductive islands along the plurality of active regions, wherein each of the plurality of select lines is formed by a metal layer together with the plurality of planarized conductive islands being simultaneously patterned and etched by a hard masking layer.

2. The scalable dual-bit flash memory array according to claim 1, wherein said dielectric-spacer structure comprises from top to bottom a sidewall dielectric spacer, a poly-oxide layer, and a conductive erasing anode being integrated with said common conductive bus line and said conductive erasing anode is spaced from said integrated floating-gate layer by a thin tunneling poly-oxide layer.

3. The scalable dual-bit flash memory array according to claim 1, wherein said integrated floating-gate layer comprises a major floating-gate layer being formed over a thin tunneling-dielectric layer and two extended floating-gate layers being separately formed on a portion of nearby raised field-oxide layers.

4. The scalable dual-bit flash memory array according to claim 1, wherein said selector region comprises a plurality of select-gate transistors being formed over a gate-dielectric layer with an implanted region formed in said semiconductor substrate for each of the plurality of select-gate transistors and said implanted region comprises a shallow implant region for threshold-voltage adjustment and a deep implant region for forming a punch-through stop.

5. The scalable dual-bit flash memory array according to claim 1, wherein said selector region comprises a plurality of planarized conductive islands being formed between a pair of sidewall dielectric spacers formed over the inner sidewalls of said stack-gate transistor regions and on said second flat bed alternately formed by common-drain diffusion region and a second etched raised field-oxide layer.

6. The scalable dual-bit flash memory array according to claim 1, wherein said hard masking layer comprises a masking dielectric layer and its two sidewall dielectric spacers being formed over said metal layer and said metal layer comprises an aluminum layer or a copper layer being formed over a refractory-metal nitride layer such as titanium-nitrides (TiN) or tantalum-nitrides (TaN).

7. The scalable dual-bit flash memory array according to claim 1, wherein said common-source diffusion region comprises a heavily-doped diffusion region being formed within a lightly-doped diffusion region.

8. The scalable dual-bit flash memory array according to claim 5, wherein said common-drain diffusion region comprises a heavily-doped diffusion region of a second conductivity type or a heavily-doped diffusion region of a second conductivity type being formed within a moderately-doped diffusion region of a first conductivity type.

* * * * *